(12) United States Patent
Tong et al.

(10) Patent No.: US 12,527,182 B2
(45) Date of Patent: Jan. 13, 2026

(54) ARRAY SUBSTRATE, DISPLAY APPARATUS, AND METHOD OF FABRICATING ARRAY SUBSTRATE

(71) Applicants: Chengdu BOE Optoelectronics Technology Co., Ltd., Sichuan (CN); BOE Technology Group Co., Ltd., Beijing (CN)

(72) Inventors: Kemeng Tong, Beijing (CN); Xiangdan Dong, Beijing (CN); Cong Fan, Beijing (CN); Rong Wang, Beijing (CN); Fan He, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 422 days.

(21) Appl. No.: 18/040,764

(22) PCT Filed: Jun. 17, 2022

(86) PCT No.: PCT/CN2022/099432
§ 371 (c)(1),
(2) Date: Feb. 6, 2023

(87) PCT Pub. No.: WO2023/240594
PCT Pub. Date: Dec. 21, 2023

(65) Prior Publication Data
US 2024/0284729 A1 Aug. 22, 2024

(51) Int. Cl.
*H10K 59/131* (2023.01)
*H10K 59/12* (2023.01)
(Continued)

(52) U.S. Cl.
CPC ....... *H10K 59/131* (2023.02); *H10K 59/1201* (2023.02); *H10K 59/40* (2023.02); *H10K 77/111* (2023.02); *H10K 2102/311* (2023.02)

(58) Field of Classification Search
CPC .. H10K 59/131; H10K 59/1201; H10K 59/40; H10K 77/111; H10K 2102/311;
(Continued)

(56) References Cited

U.S. PATENT DOCUMENTS 11,908,398 B2 * 2/2024 Kim ............... H10K 50/84
2018/0061895 A1 * 3/2018 Kim ............... H10K 59/122
(Continued)

*Primary Examiner* — J. E. Schoenholtz
(74) *Attorney, Agent, or Firm* — Intellectual Valley Law, P.C.

(57) ABSTRACT

An array substrate is provided. The array substrate includes a plurality of bonding pins in a bonding pin area. A respective bonding pin of the plurality of bonding pins is a stacked structure comprising N number of metal sub-layers sequentially arranged on a base substrate, a first metal sub-layer of the N number of metal sub-layers being on a side of an N-th metal sub-layer of the N number of metal sub-layers closer to the base substrate, the N-th metal sub-layer being a last metal sub-layer of the respective bonding pin, N is an integer≥2. In a first cross-section along a plane perpendicular to the base substrate, parallel to at least one of two lateral sides, and intersecting the N number of metal sub-layers of the respective bonding pin, any of the first metal sub-layer to an (N−1)-th metal sub-layer of the respective bonding pin are completely unexposed.

18 Claims, 15 Drawing Sheets

(51) Int. Cl.
*H10K 59/40* (2023.01)
*H10K 77/10* (2023.01)
*H10K 102/00* (2023.01)

(58) Field of Classification Search
CPC .... G06F 3/0412; G06F 3/0445; G06F 3/0446; G06F 3/04164; G06F 2203/04102; G06F 2203/04103; H10D 86/441; H10D 86/60
See application file for complete search history.

(56) References Cited

U.S. PATENT DOCUMENTS

2022/0114955 A1* 4/2022 Kim ..................... H10D 86/60
2023/0060896 A1* 3/2023 Zhang ................... H10K 59/40

* cited by examiner

ARRAY SUBSTRATE, DISPLAY APPARATUS, AND METHOD OF FABRICATING ARRAY SUBSTRATE

CROSS-REFERENCE TO RELATED APPLICATION

This application is a national stage application under 35 U.S.C. § 371 of International Application No. PCT/CN2022/099432, filed Jun. 17, 2022, the contents of which are incorporated by reference in the entirety.

TECHNICAL FIELD

The present invention relates to display technology, more particularly, to an array substrate, a display apparatus, and a method of fabricating an array substrate.

BACKGROUND

A flexible display apparatus is a bendable or deformable display apparatus having a flexible display panel. Examples of flexible display apparatuses include a flexible organic light emitting diode (OLED) display apparatus, a flexible electrophoretic display (EPD) apparatus, and a flexible liquid crystal display (LCD) apparatus. As a new generation display apparatus, the flexible display apparatus is thinner and lighter, having high contrast, high responsiveness, and high brightness. It also provides full color and a wide viewing angle. The flexible display apparatus has found a wide range of applications in mobiles phones, personal digital assistance (PDAs), digital cameras, on-board displays, notebook computers, on-wall televisions, as well as various military applications. A flexible display apparatus includes a flexible array substrate. A base substrate of the flexible array substrate can be made of flexible material such as plastic.

SUMMARY

In one aspect, the present disclosure provides an array substrate, comprising a plurality of bonding pins in a bonding pin area; wherein a respective bonding pin of the plurality of bonding pins is a stacked structure comprising N number of metal sub-layers sequentially arranged on a base substrate, a first metal sub-layer of the N number of metal sub-layers being on a side of an N-th metal sub-layer of the N number of metal sub-layers closer to the base substrate, the N-th metal sub-layer being a last metal sub-layer of the respective bonding pin, N is an integer≥2; wherein, in plan view of the array substrate, the respective bonding pin has an elongated shape having two longitudinal sides and two lateral sides; and in a first cross-section along a plane perpendicular to the base substrate, parallel to at least one of the two lateral sides, and intersecting the N number of metal sub-layers of the respective bonding pin, any of the first metal sub-layer to an (N−1)-th metal sub-layer of the respective bonding pin are completely unexposed.

Optionally, in the first cross-section, the N-th metal sub-layer is in direct contact with the (N−1)-th metal sub-layer; and an edge of the (N−1)-th metal sub-layer along at least one of the two longitudinal sides is encapsulated by the N-th metal sub-layer, thereby rendering the edge of the (N−1)-th metal sub-layer along at least one of the two longitudinal sides unexposed.

Optionally, edges of the (N−1)-th metal sub-layer along both of the two longitudinal sides are encapsulated by the N-th metal sub-layer and an underlying layer together, thereby rendering the edges of the (N−1)-th metal sub-layer along both of the two longitudinal sides unexposed.

Optionally, an orthographic projection of the N-th metal sub-layer on the base substrate completely covers an orthographic projection of the (N−1)-th metal sub-layer on the base substrate.

Optionally, in the first cross-section, the n-th metal sub-layer is in direct contact with the (n−1)-th metal sub-layer, 1<n≤N; and an edge of the (n−1)-th metal sub-layer along at least one of the two longitudinal sides is encapsulated by the n-th metal sub-layer.

Optionally, edges of the (n−1)-th metal sub-layer along both of the two longitudinal sides are encapsulated by the n-th metal sub-layer and an underlying layer together, thereby rendering the edges of the (n−1)-th metal sub-layer along both of the two longitudinal sides unexposed, 1<n≤N.

Optionally, an orthographic projection of the n-th metal sub-layer on the base substrate completely covers an orthographic projection of the (n−1)-th metal sub-layer on the base substrate, 1<n≤N.

Optionally, the array substrate further comprises a touch control structure in at least a display area of the array substrate; wherein the touch control structure comprises a first touch electrode layer on a buffer layer; a touch insulating layer on a side of the first touch electrode layer away from the buffer layer; and a second touch electrode layer on a side of the touch insulating layer away from the first touch electrode layer; the (N−1)-th metal sub-layer is in a same layer as the first touch electrode layer; and the N-th metal sub-layer is in a same layer as the second touch electrode layer.

Optionally, the array substrate further comprises a plurality of transition structures in the bonding pin area; wherein a respective transition structure of the plurality of transition structures comprises a stacked structure comprising an (N'−2)-th metal sub-layer, an (N'−1)-th metal sub-layer, and an N'-th metal sub-layer sequentially arranged on the base substrate; the (N'−2)-th metal sub-layer and an (N−2)-th metal sub-layer are parts of a unitary structure extending in the bonding pin area; the (N'−1)-th metal sub-layer and the (N−1)-th metal sub-layer are parts of a unitary structure extending in the bonding pin area; the N'-th metal sub-layer and the N-th metal sub-layer are parts of a unitary structure extending in the bonding pin area; the respective transition structure has at least one less metal sub-layer than the respective bonding pin; and in a second cross-section along a plane perpendicular to the base substrate, parallel to at least one of the two lateral sides of the elongated shape of the respective bonding pin, and intersecting all metal sub-layers of the respective transition structure, the (N'−2)-th metal sub-layer and the (N'−1)-th metal sub-layer of the respective transition structure are completely unexposed, N' being an integer≥2.

Optionally, an orthographic projection of the N'-th metal sub-layer on the base substrate completely covers an orthographic projection of the (N'−1)-th metal sub-layer on the base substrate.

Optionally, the (N'−1)-th metal sub-layer is in direct contact with the (N'−2)-th metal sub-layer; and in the second cross-section, the (N'−2)-th metal sub-layer is encapsulated by the (N'−1)-th metal sub-layer, thereby rendering the (N'−2)-th metal sub-layer unexposed.

Optionally, the respective transition structure comprises a first-transition metal sub-layer in a same layer as a second signal line layer in a display area; a planarization layer on the first-transition metal sub-layer; a second-transition metal sub-layer in a same layer as a first touch electrode layer in the display area, on a side of the planarization layer away from the first-transition metal sub-layer, the second-transition metal sub-layer connecting to the first-transition metal sub-layer through a via extending through the planarization layer; a touch insulating layer on a side of the second-transition metal sub-layer away from the planarization layer; and a third-transition metal sub-layer in a same layer as a second touch electrode layer in the display area, on a side of the touch insulating layer away from the second-transition metal sub-layer, the third-transition metal sub-layer connecting to the second-transition metal sub-layer through a via extending through the touch insulating layer; wherein the touch insulating layer encapsulates edges of the second-transition metal sub-layer.

Optionally, the array substrate further comprises a plurality of connecting lines in a fanout area; wherein a respective connecting line of the plurality of connecting lines comprises a stacked structure comprising an (N"−1)-th metal sub-layer and an N"-th metal sub-layer sequentially arranged on the base substrate; the (N"−1)-th metal sub-layer and the (N−1)-th metal sub-layer are parts of a unitary structure extending from the fanout area into the bonding pin area; the N"-th metal sub-layer and the N-th metal sub-layer are parts of a unitary structure extending from the fanout area into the bonding pin area; the respective connecting line has at least one less metal sub-layer than the respective bonding pin; and in a third cross-section along a plane perpendicular to the base substrate, parallel to at least one of the two lateral sides of the elongated shape of the respective bonding pin, and intersecting all metal sub-layers of the respective connecting line, the (N"−1)-th metal sub-layer of the respective connecting line is completely unexposed, N" being an integer≥2.

Optionally, an orthographic projection of the N"-th metal sub-layer on the base substrate completely covers an orthographic projection of the (N"−1)-th metal sub-layer on the base substrate.

Optionally, the N"-th metal sub-layer is in direct contact with the (N"−1)-th metal sub-layer; and in the third cross-section, the (N"−1)-th metal sub-layer is encapsulated by the N"-th metal sub-layer, thereby rendering the (N"−1)-th metal sub-layer unexposed.

Optionally, the respective connecting line comprises a first connecting metal sub-layer in a same layer as a first touch electrode layer in a display area; and a second connecting metal sub-layer in a same layer as a second touch electrode layer in the display area, and on the first connecting metal sub-layer; wherein the respective connecting line is on a stacked structure comprises a first signal line layer on a base substrate; a passivation layer on the first signal line layer; a second signal line layer on a side of the passivation layer away from the first signal line layer; a planarization layer on a side of the second signal line layer away from the passivation layer; and a buffer layer on a side of the planarization layer away from the second signal line layer.

Optionally, the plurality of bonding pins comprise multiple first bonding pins configured for bonding an integrated circuit; wherein a respective first bonding pin of the multiple first bonding pins comprises a first-first metal sub-layer in a same layer as a first conductive layer in a display area; an insulating layer and/or an inter-layer dielectric layer on the first-first metal sub-layer; a second-first metal sub-layer in a same layer as a first signal line layer in the display area, on a side of the insulating layer and/or the inter-layer dielectric layer away from the first-first metal sub-layer, the second-first metal sub-layer connecting to the first-first metal sub-layer through a via extending through the insulating layer and/or the inter-layer dielectric layer; a third-first metal sub-layer in a same layer as a second signal line layer in the display area, the third-first metal sub-layer encapsulating the second-first metal sub-layer; a fourth-first metal sub-layer in a same layer as a first touch electrode layer in the display area, the fourth-first metal sub-layer encapsulating an edge of the third-first metal sub-layer along at least one of the two longitudinal sides; and a fifth-first metal sub-layer in a same layer as a second touch electrode layer in the display area, the fifth-first metal sub-layer encapsulating an edge of the fourth-first metal sub-layer along at least one of the two longitudinal sides.

Optionally, the plurality of bonding pins comprise multiple second bonding pins configured for bonding a printed circuit; wherein a respective second bonding pin of the multiple second bonding pins comprises a first-second metal sub-layer in a same layer as a first signal line layer in a display area; a passivation layer on the first-second metal sub-layer; a second-second metal sub-layer in a same layer as a second signal line layer in the display area, on a side of the passivation layer away from the first-second metal sub-layer, the second-second metal sub-layer connecting to the first-second metal sub-layer through a via extending through the passivation layer; a planarization layer on a side of the second-second metal sub-layer away from the passivation layer; a third-second metal sub-layer in a same layer as a first touch electrode layer in the display area, on a side of the planarization layer away from the second-second metal sub-layer, the third-second metal sub-layer connecting to the second-second metal sub-layer through a via extending through the planarization layer; and a fourth-second metal sub-layer in a same layer as a second touch electrode layer in the display area, the fourth-second metal sub-layer encapsulating both edges of the third-second metal sub-layer along the two longitudinal sides.

In another aspect, the present disclosure provides a display apparatus, comprising the array substrate described herein or fabricated by a method described herein, an integrated circuit bonded to the array substrate in the bonding pin area.

In another aspect, the present disclosure provides a method of fabricating an array substrate, comprising forming a plurality of bonding pins in a bonding pin area; wherein forming a respective bonding pin of the plurality of bonding pins comprise forming a stacked structure comprising N number of metal sub-layers sequentially arranged on a base substrate, a first metal sub-layer of the N number of metal sub-layers being on a side of an N-th metal sub-layer of the N number of metal sub-layers closer to the base substrate, the N-th metal sub-layer being a last metal sub-layer of the respective bonding pin, N is an integer≥2; wherein, in plan view of the array substrate, the respective bonding pin has an elongated shape having two longitudinal sides and two lateral sides; and in a first cross-section along a plane perpendicular to the base substrate, parallel to at least one of the two lateral sides, and intersecting the N number of metal sub-layers of the respective bonding pin, any of the first metal sub-layer to an (N−1)-th metal sub-layer are completely unexposed.

BRIEF DESCRIPTION OF THE FIGURES

The following drawings are merely examples for illustrative purposes according to various disclosed embodiments and are not intended to limit the scope of the present invention.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

The present disclosure provides, inter alia, an array substrate, a display apparatus, and a method of fabricating an array substrate that substantially obviate one or more of the problems due to limitations and disadvantages of the related art. In one aspect, the present disclosure provides an array substrate. In some embodiments, the array substrate includes a plurality of bonding pins in a bonding pin area. In some embodiments, a respective bonding pin of the plurality of bonding pins is a stacked structure comprising N number of metal sub-layers sequentially arranged on a base substrate, a first metal sub-layer of the N number of metal sub-layers being on a side of an N-th metal sub-layer of the N number of metal sub-layers closer to the base substrate, the N-th metal sub-layer being a last metal sub-layer of the respective bonding pin, N is an integer≥2. Optionally, in plan view of the array substrate, the respective bonding pin has an elongated shape having two longitudinal sides and two lateral sides. Optionally, in a first cross-section along a plane perpendicular to the base substrate, parallel to at least one of the two lateral sides, and intersecting the N number of metal sub-layers of the respective bonding pin, any of the first metal sub-layer to an (N−1)-th metal sub-layer are completely unexposed.

Figure 1:
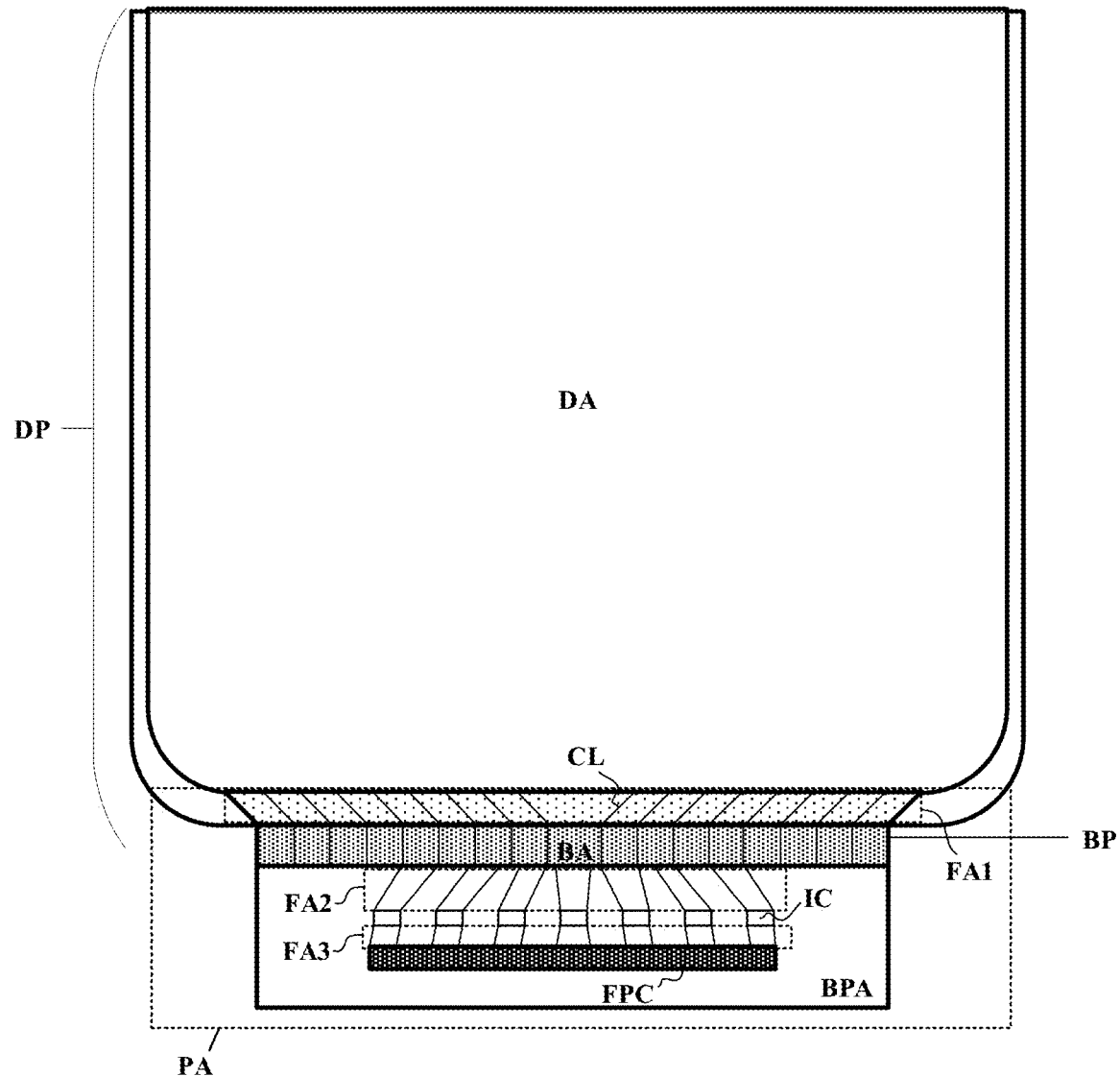
FIG. 1 is a plan view of an array substrate in some embodiments according to the present disclosure.

FIG. 1 is a plan view of an array substrate in some embodiments according to the present disclosure. Referring to FIG. 1, the display apparatus includes one or more integrated circuits IC and a printed circuit FPC bonded to the display apparatus in a peripheral area PA of the display apparatus. The peripheral area PA is outside of a display area DA of the display apparatus. As used herein the term "peripheral area" refers to an area where various circuits and wires are provided to transmit signals to the display apparatus. To increase the transparency of the display apparatus, non-transparent or opaque components of the display apparatus (e.g., battery, printed circuit board, metal frame), can be disposed in the peripheral area rather than in the display area. As used herein, the term "display area" refers to an area of a display apparatus where image is actually displayed. Optionally, the display area may include both a subpixel region and an inter-subpixel region. A subpixel region refers to a light emission region of a subpixel, such as a region corresponding to a pixel electrode in a liquid crystal display or a region corresponding to a light emissive layer in an organic light emitting diode display panel. An inter-subpixel region refers to a region between adjacent subpixel regions, such as a region corresponding to a black matrix in a liquid crystal display or a region corresponding a pixel definition layer in an organic light emitting diode display panel. Optionally, the inter-subpixel region is a region between adjacent subpixel regions in a same pixel. Optionally, the inter-subpixel region is a region between two adjacent subpixel regions from two adjacent pixels.

Referring to FIG. 1, the peripheral area PA in some embodiments includes one or more fanout areas, e.g., a first fanout area FA1, a second fanout area FA2, and a third fanout area FA3. In each of the fanout areas, the array substrate includes a plurality of connecting lines CL. The first fanout area FA1 is between a bending area BA and the display area DA. The second fanout area FA2 is between the bending area BA and one or more integrated circuits IC. The third fanout area FA3 is between the one or more integrated circuits IC and the printed circuit FPC.

Figure 2A:
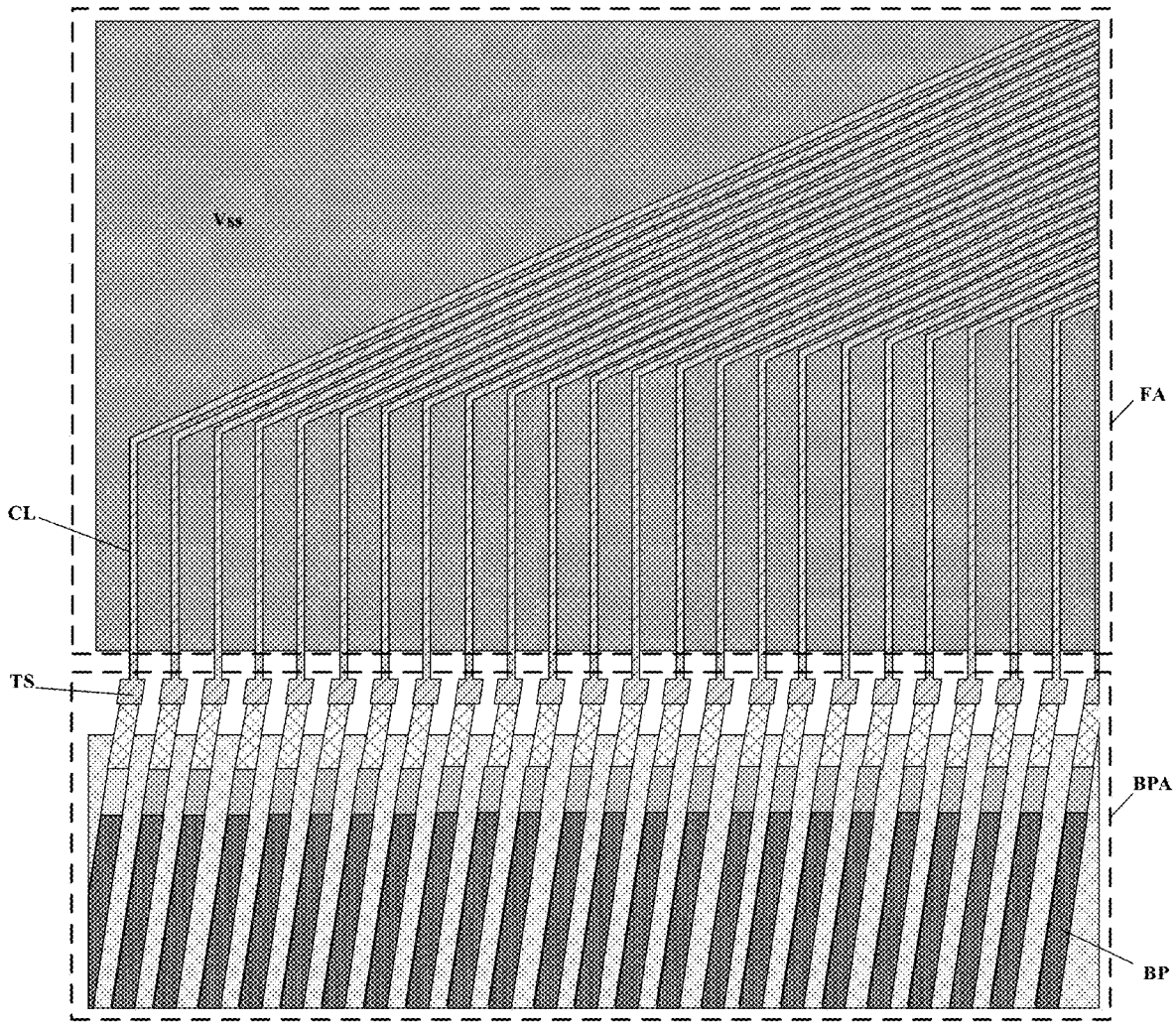
FIG. 2A is a zoom-in view of a portion of a peripheral area in an array substrate in some embodiments of the present disclosure.

FIG. 2A is a zoom-in view of a portion of a peripheral area in an array substrate in some embodiments of the present disclosure. Referring to FIG. 2A, the peripheral area includes a bonding pin area BPA and a fanout area FA. The integrated circuit and/or the printed circuit are bonded to the array substrate in the bonding pin area BPA. The fanout area FA in FIG. 2A may correspond to, e.g., the third fanout area FA3 in FIG. 1.

Figure 2B:
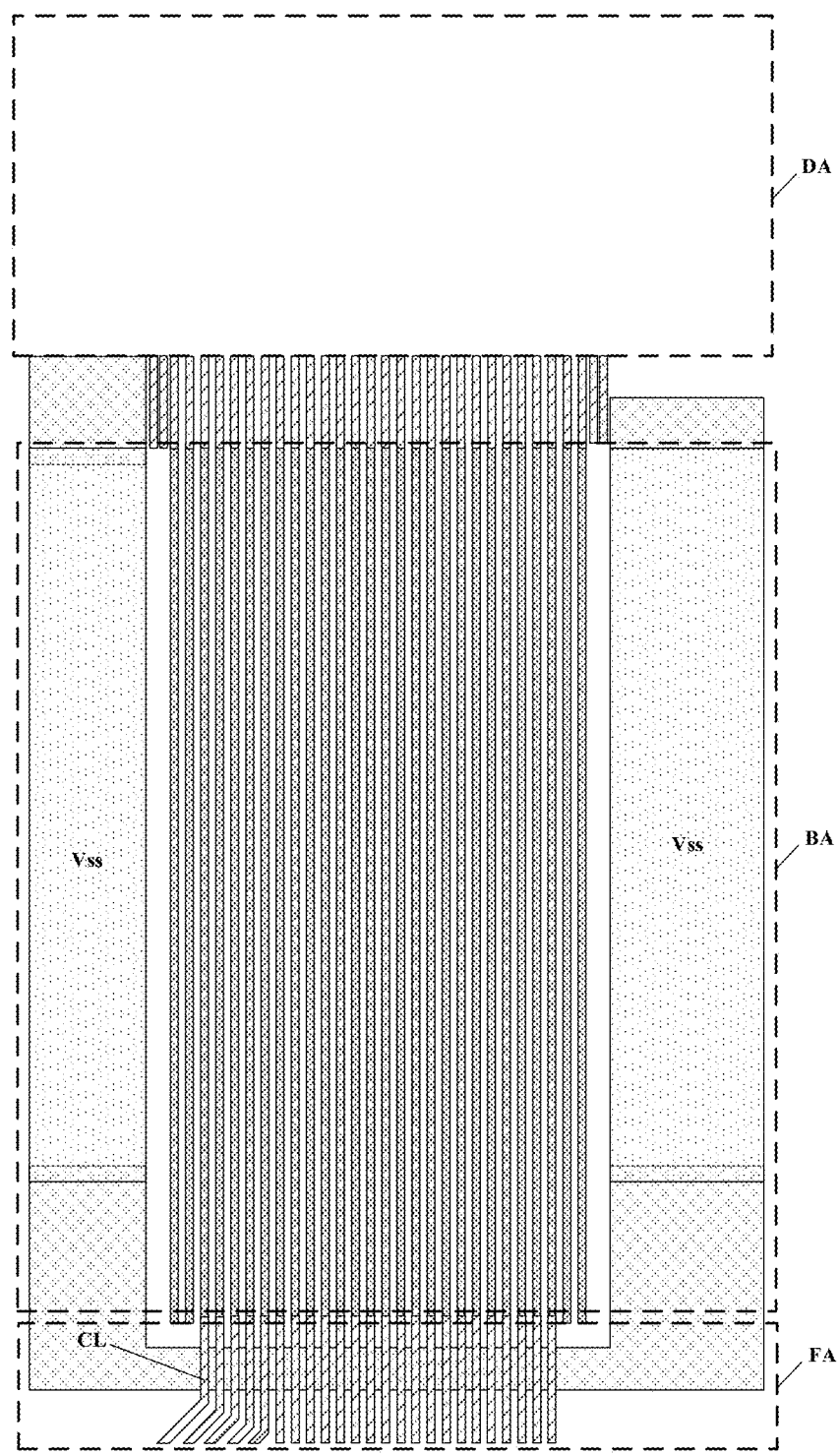
FIG. 2B is a zoom-in view of a portion of a peripheral area in an array substrate in some embodiments of the present disclosure.

FIG. 2B is a zoom-in view of a portion of a peripheral area in an array substrate in some embodiments of the present disclosure. Referring to FIG. 2B, the peripheral area includes a bending area BA adjacent to the display area DA, and a fanout area FA on a side of the bending area BA away from the display area DA. A plurality of connecting lines CL extend through the bending area BA into the fanout area FA. The array substrate further includes a voltage supply line (e.g., denoted as Vss in FIG. 2A and FIG. 2B) in the bending area BA, configured to provide a constant voltage signal (e.g., a low voltage signal) to the array substrate. The fanout area FA in FIG. 2B may correspond to, e.g., the third fanout area FA3 in FIG. 1.

Figure 3:
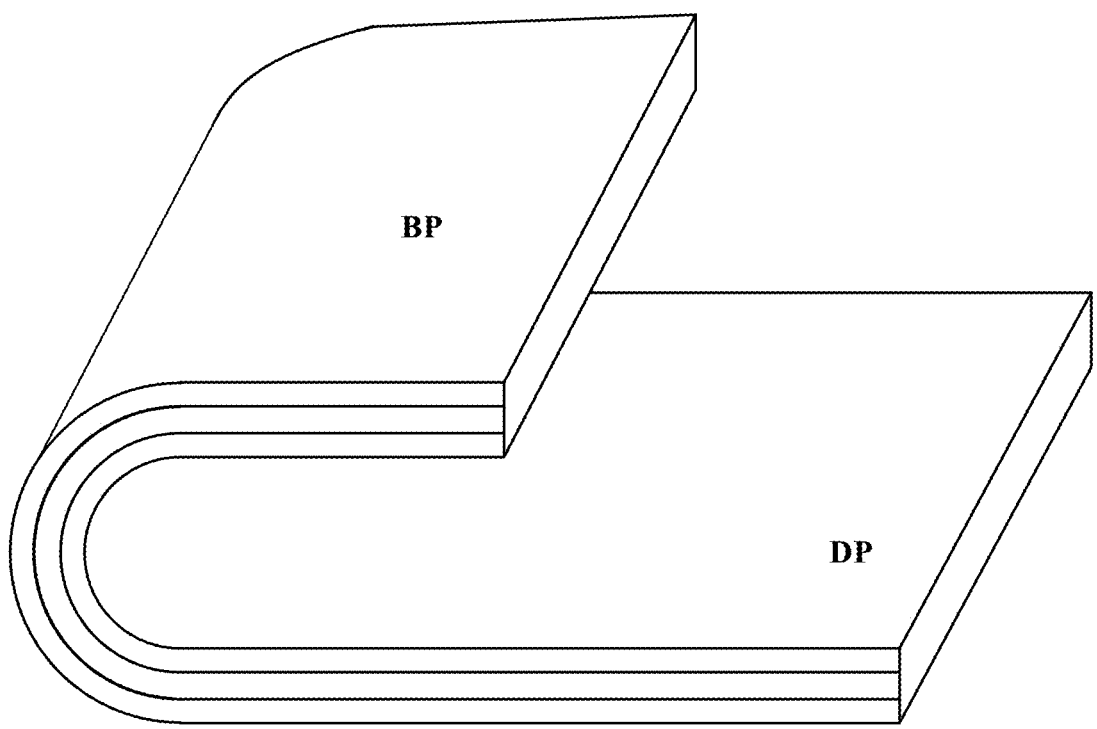
FIG. 3 is a schematic diagram of an array substrate in some embodiments according to the present disclosure.

FIG. 3 is a schematic diagram of an array substrate in some embodiments according to the present disclosure. FIG. 3 depicts an array substrate in which a bending portion BP is bent, and a portion of the array substrate is bent toward the back side of a display portion DP.

Referring to FIG. 1 again, the display portion DP in some embodiments is in a display area DR in which an image is displayed, a bending portion BP is in a bending area BA. A fanout area FA is between the display area DA and the bonding pin area BPA. The display portion DP includes a plurality of connecting lines CL extending through the fanout area FA.

Figure 4:
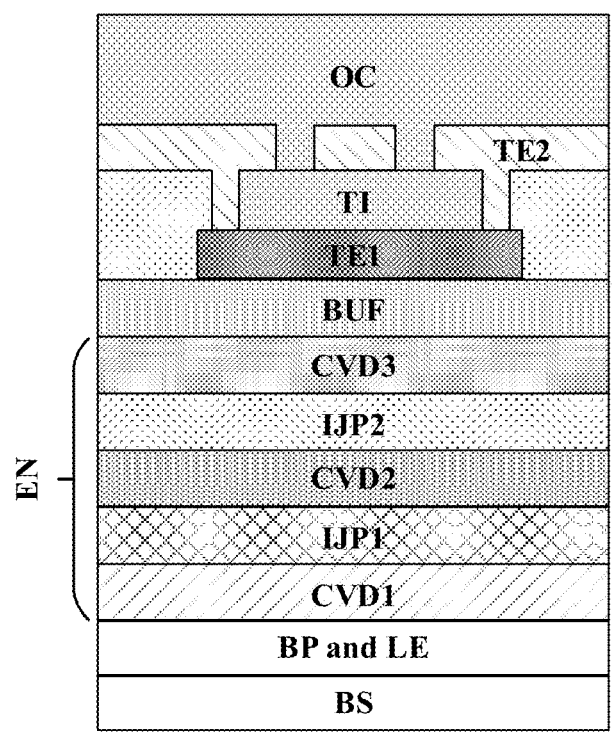
FIG. 4 is a schematic diagram of a stacked structure in a display area of an array substrate in some embodiments of the present disclosure.

FIG. 4 is a schematic diagram of a stacked structure in a display area of an array substrate in some embodiments of the present disclosure. Referring to FIG. 4, the array substrate in some embodiments includes a base substrate BS; a back panel (including a plurality of transistors) and a plurality of light emitting elements LE on the base substrate BS; an encapsulating layer EN on a side of the plurality of light emitting elements LE away from the base substrate BS, encapsulating the plurality of light emitting elements LE; a buffer layer BUF on a side of the encapsulating layer EN away from the base substrate BS; a first touch electrode layer TE1 on a side of the buffer layer BUF away from the encapsulating layer EN; a touch insulating layer TI on a side of the first touch electrode layer TE1 away from the buffer layer BUF; a second touch electrode layer TE2 on a side of the touch insulating layer TI away from the first touch electrode layer TE1; and an overcoat layer OC on a side of the second touch electrode layer TE2 away from the touch insulating layer. In some embodiments, the buffer layer BUF is made of a flexible organic insulating material to further enhance the flexibility.

In some embodiments, the encapsulating layer EN includes a first inorganic encapsulating sub-layer CVD1, a first organic encapsulating sub-layer IJP1 on the first inorganic encapsulating sub-layer CVD1, a second inorganic encapsulating sub-layer CVD2 on a side of the first organic encapsulating sub-layer IJP1 away from the first inorganic encapsulating sub-layer CVD1, a second organic encapsulating sub-layer IJP2 on a side of the second inorganic encapsulating sub-layer CVD2 away from the first organic encapsulating sub-layer IJP1, and a third inorganic encapsulating sub-layer CVD3 on a side of the second organic encapsulating sub-layer IJP2 away from the second inorganic encapsulating sub-layer CVD2. By having multiple organic encapsulating sub-layers, the flexibility and bendability of the array substrate may be further enhanced. In some embodiments, the touch insulating layer TI is made of a flexible organic insulating material to further enhance the flexibility.

In a related array substrate, certain metal sub-layers (e.g., a sub-layer in a same layer as a signal line layer in the display area) of the bonding pins and traces in the peripheral area are at least partially exposed (e.g., along their edges) in the process of forming top metal sub-layers (e.g., a sub-layer in a same layer as one of the touch electrode layer). Similarly, in the related array substrate, one of the top metal sub-layers (e.g., a sub-layer in a same layer as a first touch electrode layer) in the peripheral area is at least partially exposed (e.g., along its edge) in the process of forming another one of the p metal sub-layers (e.g., a sub-layer in a same layer as a second touch electrode layer). The exposed metal sub-layer is prone to over-etching issue during an etching process in forming the top metal sub-layers, leading to conductivity issues and non-uniformity in signal transmission. The inventors of the present disclosure, surprisingly and unexpectedly, discover that an intricate structure of the present array substrate can obviate the issues in the related array substrate.

Figure 5:
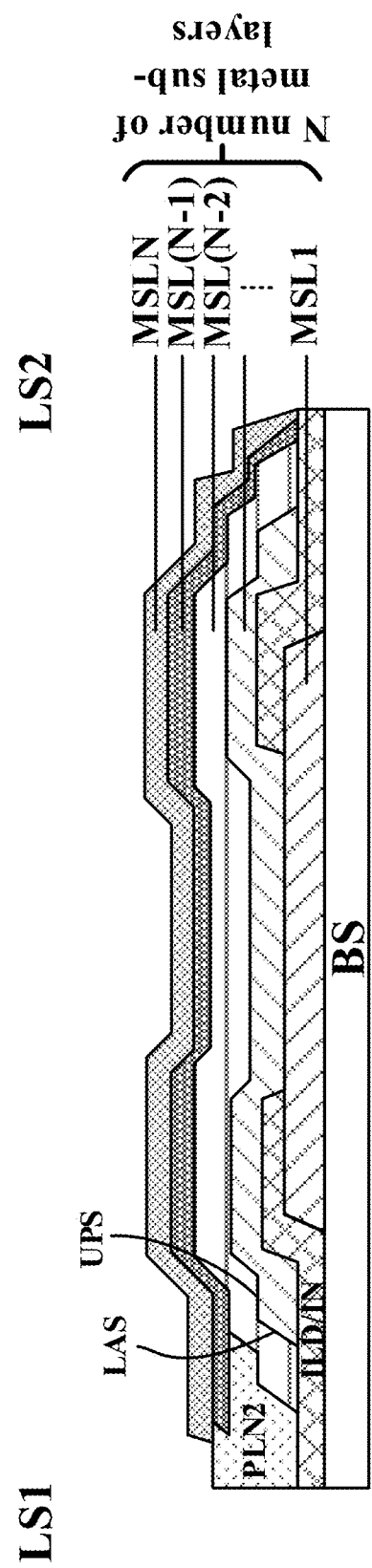
FIG. 5 is a cross-section of a respective bonding pin in an array substrate in some embodiments of the present disclosure.

FIG. 5 is a cross-section of a respective bonding pin in an array substrate in some embodiments of the present disclosure. Referring to FIG. 5, in some embodiments, the respective bonding pin of the plurality of bonding pins is a stacked structure comprising N number of metal sub-layers sequentially arranged on a base substrate BS. A first metal sub-layer MSL1 of the N number of metal sub-layers is on a side of an N-th metal sub-layer MSLN of the N number of metal sub-layers closer to the base substrate BS. The N-th metal sub-layer MSLN is a last metal sub-layer of the respective bonding pin. Optionally, N is an integer≥2.

Figure 6:
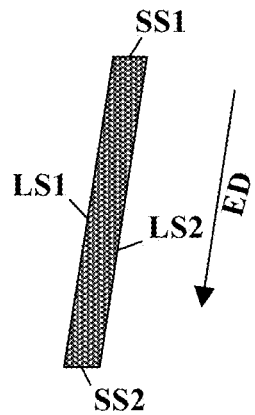
FIG. 6 is a plan view of a respective bonding pin in some embodiments of the present disclosure.

FIG. 6 is a plan view of a respective bonding pin in some embodiments of the present disclosure. Referring to FIG. 6, in plan view of the array substrate, the respective bonding pin has an elongated shape having two longitudinal sides (e.g., LS1 and LS2) and two lateral sides (e.g., SS1 and SS2).

In some embodiments, in a first cross-section along a plane perpendicular to the base substrate, parallel to at least one of the two lateral sides, and intersecting the N number of metal sub-layers of the respective bonding pin (for example, the cross-section as shown in FIG. 5), any of the first metal sub-layer to an (N−1)-th metal sub-layer are completely unexposed. As used herein, the term "completely unexposed" refers to that, in the first cross-section, a perimeter of a sub-layer on an underlying sub-layer is completely surrounded by one or more sub-layers on top of the sub-layer, and the underlying layer together. The sub-layer may be covered by a metal sub-layer on top and the underlying sub-layer underneath together. Alternatively, the sub-layer may be partially covered by an insulating layer on top, partially covered by a metal sub-layer on top, and the underlying sub-layer together.

In some embodiments, in the first cross-section, the N-th metal sub-layer MSLN is in direct contact with the (N−1)-th metal sub-layer MSL(N−1). Optionally, an edge of the (N−1)-th metal sub-layer MSL(N−1) along at least one of the two longitudinal sides is encapsulated by the N-th metal sub-layer MSLN, thereby rendering the edge of the (N−1)-th metal sub-layer MSL(N−1) along at least one of the two longitudinal sides unexposed. As shown in FIG. 5, an edge on the right side (proximal to the second longitudinal side LS2) of the (N−1)-th metal sub-layer MSL(N−1) along the second longitudinal side LS2 is encapsulated by the N-th metal sub-layer MSLN, thereby rendering the edge of the (N−1)-th metal sub-layer MSL(N−1) along the second longitudinal side LS2 unexposed. As used herein, the term "edge" refers to, in a cross-section, a portion of a layer or an object where an upper surface and a lower surface of the layer or the object are joined each other, either directly, or indirectly through a lateral surface. As used herein, the term "encapsulated" refers to that the upper surface of the edge, or the upper surface and the lateral surface of the edge when the lateral surface is present, is/are completely covered by another layer. The lower surface of the edge portion is typically in contact with an underlying layer, and is completely covered by the underlying layer. An exemplary lateral surface ("LAS") and an exemplary upper surface ("UPS") are denoted in FIG. 5.

Referring to FIG. 5, an edge on the left side (proximal to the first longitudinal side LS1) of the (N−1)-th metal sub-layer MSL(N−1) is encapsulated by a second planarization layer PLN2, thereby rendering the edge of the (N−1)-th metal sub-layer MSL(N−1) along the first longitudinal side LS1 unexposed.

Referring to FIG. 5, in some embodiments, in the first cross-section, the (N−1)-th metal sub-layer MSL(N−1) is in direct contact with the (N−2)-th metal sub-layer MSL(N−2). Optionally, an edge of the (N−2)-th metal sub-layer MSL(N−2) along at least one of the two longitudinal sides is encapsulated by the (N−1)-th metal sub-layer MSL(N−1), thereby rendering the edge of the (N−2)-th metal sub-layer MSL(N−2) along at least one of the two longitudinal sides unexposed. As shown in FIG. 5, an edge on the right side (proximal to the second longitudinal side LS2) of the (N−2)-th metal sub-layer MSL(N−2) along the second longitudinal side LS2 is encapsulated by the (N−1)-th metal sub-layer MSL(N−1), thereby rendering the edge of the (N−2)-th metal sub-layer MSL(N−2) along the second longitudinal side LS2 unexposed.

Referring to FIG. 5, an edge on the left side (proximal to the first longitudinal side LS1) of the (N−2)-th metal sub-layer MSL(N−2) is encapsulated by a second planarization layer PLN2, thereby rendering the edge of the (N−2)-th metal sub-layer MSL(N−2) along the first longitudinal side LS1 unexposed.

Figure 7:
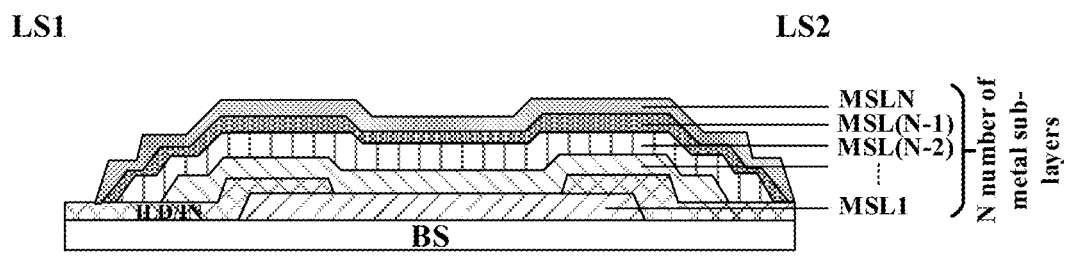
FIG. 7 is a cross-section of a respective bonding pin in an array substrate in some embodiments of the present disclosure.

FIG. 7 is a cross-section of a respective bonding pin in an array substrate in some embodiments of the present disclosure. Referring to FIG. 7, edges of the (N−1)-th metal sub-layer along both of the two longitudinal sides are encapsulated by the N-th metal sub-layer and an underlying layer (ILD/IN) together, thereby rendering the edges of the (N−1)-th metal sub-layer along both of the two longitudinal sides unexposed. Optionally, edges of the (N−2)-th metal sub-layer along both of the two longitudinal sides are encapsulated by the (N−1)-th metal sub-layer and an underlying layer (ILD/IN) together, thereby rendering the edges of the (N−2)-th metal sub-layer along both of the two longitudinal sides unexposed.

Referring to FIG. 5 and FIG. 7, in some embodiments, an orthographic projection of the N-th metal sub-layer MSLN on the base substrate BS completely covers an orthographic projection of the (N−1)-th metal sub-layer MSL(N−1) on the base substrate BS. Optionally, an orthographic projection of the n-th metal sub-layer on the base substrate completely covers an orthographic projection of the (n−1)-th metal sub-layer on the base substrate, 1<n≤ N.

Referring to FIG. 5 and FIG. 7, in some embodiments, in the first cross-section, the n-th metal sub-layer is in direct contact with the (n−1)-th metal sub-layer, 1<n≤ N. Optionally, an edge of the (n−1)-th metal sub-layer along at least one of the two longitudinal sides is encapsulated by the n-th metal sub-layer. Referring to FIG. 7, optionally, edges of the (n−1)-th metal sub-layer along both of the two longitudinal sides are encapsulated by the n-th metal sub-layer and an underlying layer together, thereby rendering the edges of the (n−1)-th metal sub-layer along both of the two longitudinal sides unexposed, 1<n≤ N.

Figure 8:
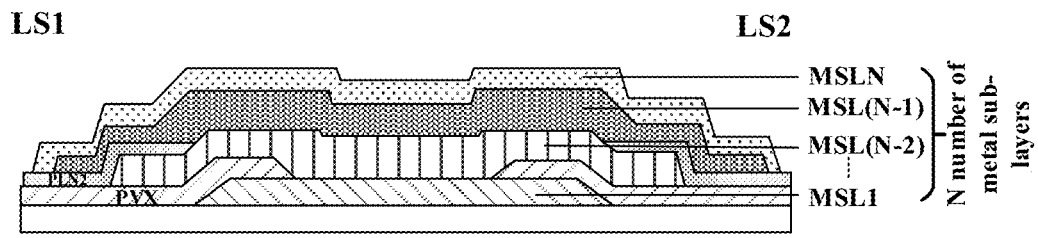
FIG. 8 is a cross-section of a respective bonding pin in an array substrate in some embodiments of the present disclosure.

FIG. 8 is a cross-section of a respective bonding pin in an array substrate in some embodiments of the present disclosure. Referring to FIG. 8, edges of the (N−1)-th metal sub-layer along both of the two longitudinal sides are encapsulated by the N-th metal sub-layer and an underlying layer (a second planarization layer PLN2) together, thereby rendering the edges of the (N−1)-th metal sub-layer along both of the two longitudinal sides unexposed. Optionally, edges of the (N−2)-th metal sub-layer along both of the two longitudinal sides are encapsulated by a second planarization layer PLN2 and an underlying layer (a passivation layer PVX) together, thereby rendering the edges of the (N−2)-th metal sub-layer along both of the two longitudinal sides unexposed.

Figure 9:
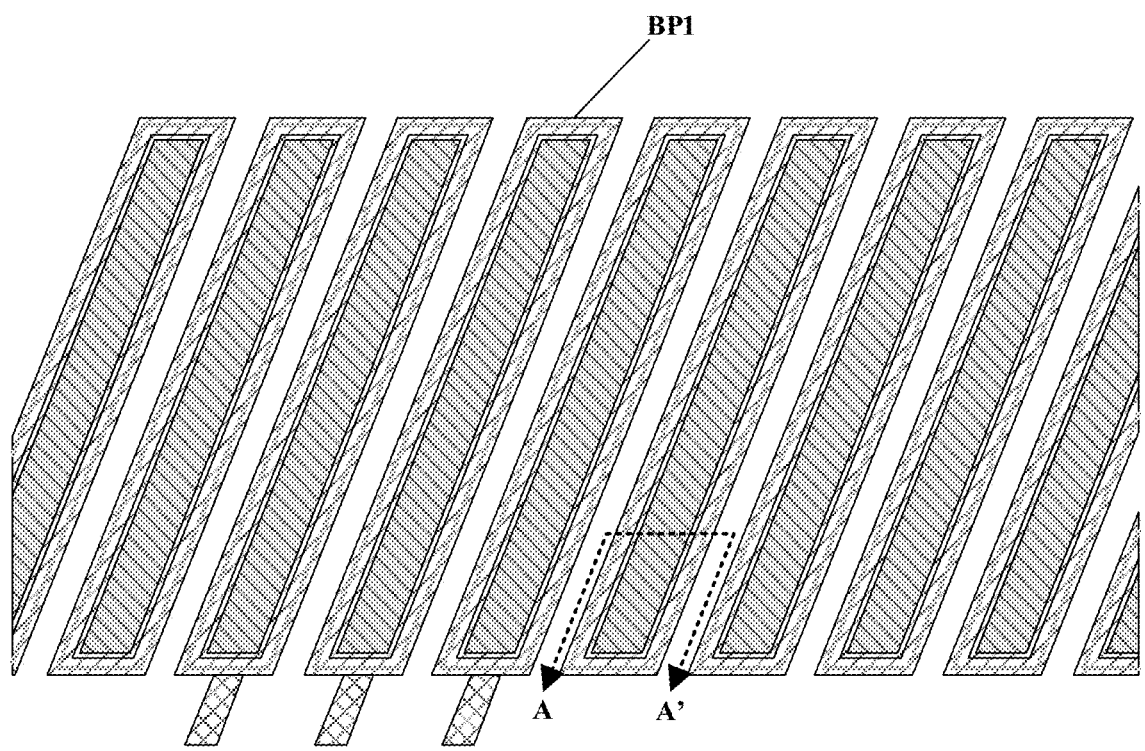
FIG. 9 is a schematic diagram of a respective first bonding pin in some embodiments of the present disclosure.
Figure 10:
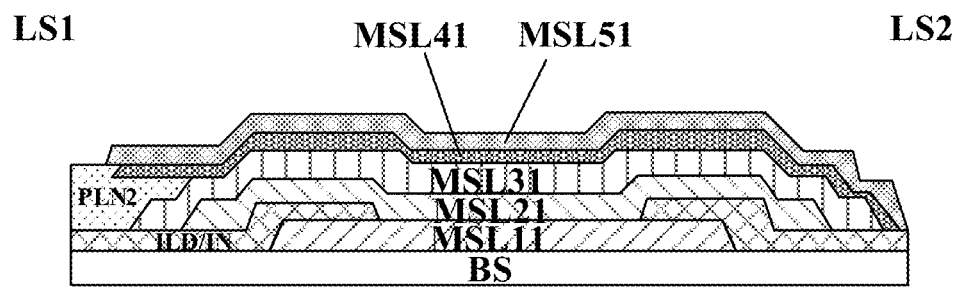
FIG. 10 is a cross-section of a respective first bonding pin in an array substrate in some embodiments of the present disclosure.
Figure 11:
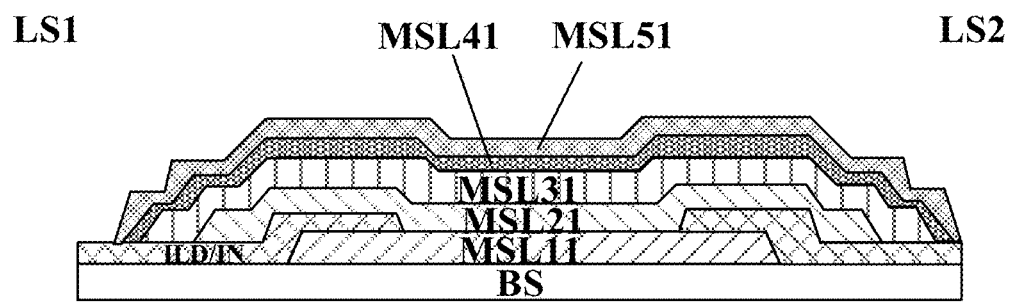
FIG. 11 is a cross-section of a respective first bonding pin in an array substrate in some embodiments of the present disclosure.

In some embodiments, the plurality of bonding pins include multiple first bonding pins configured for bonding an integrated circuit. FIG. 9 is a schematic diagram of a respective first bonding pin in some embodiments of the present disclosure. FIG. 10 is a cross-section of a respective first bonding pin in an array substrate in some embodiments of the present disclosure. FIG. 11 is a cross-section of a respective first bonding pin in an array substrate in some embodiments of the present disclosure. FIG. 10 or FIG. 11 may be a cross-sectional view along an A-A' in FIG. 9. Referring to FIG. 9 to FIG. 11, the respective first bonding pin BP1 in some embodiments includes a first-first metal sub-layer MSL11 in a same layer as a first conductive layer in a display area; an insulating layer IN and/or an inter-layer dielectric layer ILD on the first-first metal sub-layer MSL11; a second-first metal sub-layer MSL21 in a same layer as a first signal line layer in the display area, on a side of the insulating layer IN and/or the inter-layer dielectric layer ILD away from the first-first metal sub-layer MSL11, the second-first metal sub-layer MSL21 connecting to the first-first metal sub-layer MSL11 through a via extending through the insulating layer IN and/or the inter-layer dielectric layer ILD; a third-first metal sub-layer MSL31 in a same layer as a second signal line layer in the display area, the third-first metal sub-layer MSL31 encapsulating the second-first metal sub-layer MSL21; a fourth-first metal sub-layer MSL41 in a same layer as a first touch electrode layer in the display area, the fourth-first metal sub-layer MSL41 encapsulating an edge of the third-first metal sub-layer MSL31 along at least one of the two longitudinal sides; and a fifth-first metal sub-layer MSL51 in a same layer as a second touch electrode layer in the display area, the fifth-first metal sub-layer MSL51 encapsulating an edge of the fourth-first metal sub-layer MSL41 along at least one of the two longitudinal sides. Referring to FIG. 10, the fourth-first metal sub-layer MSL41 encapsulates an edge of the third-first metal sub-layer MSL31 along only one of the two longitudinal sides; and the fifth-first metal sub-layer MSL51 encapsulates an edge of the fourth-first metal sub-layer MSL41 along only one of the two longitudinal sides. Referring to FIG. 11, the fourth-first metal sub-layer MSL41 encapsulates both edges of the third-first metal sub-layer MSL31 along both of the two longitudinal sides; and the fifth-first metal sub-layer MSL51 encapsulates both edges of the fourth-first metal sub-layer MSL41 along both of the two longitudinal sides.

Figure 12:
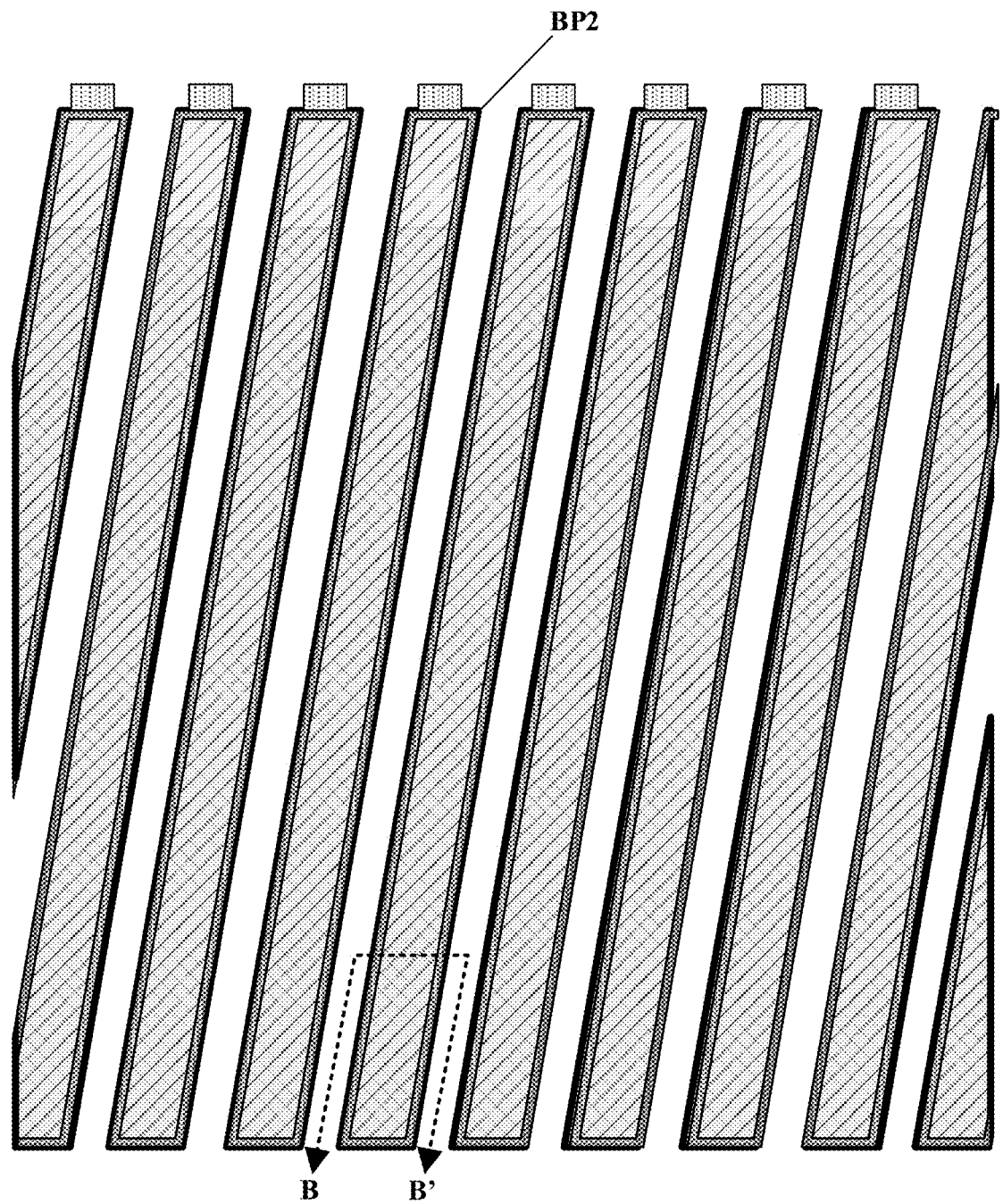
FIG. 12 is a schematic diagram of a respective second bonding pin in some embodiments of the present disclosure.
Figure 13:
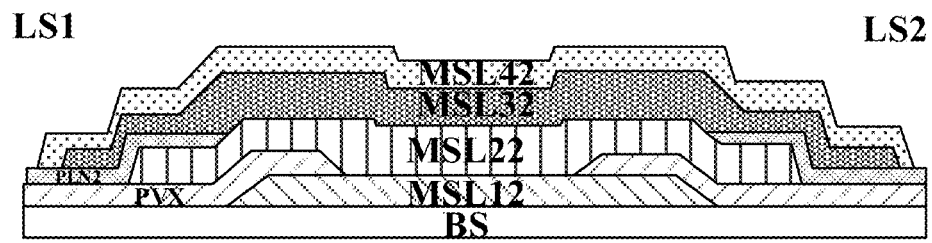
FIG. 13 is a cross-section of a respective second bonding pin in an array substrate in some embodiments of the present disclosure.

In some embodiments, the plurality of bonding pins include multiple second bonding pins configured for bonding a printed circuit. FIG. 12 is a schematic diagram of a respective second bonding pin in some embodiments of the present disclosure. FIG. 13 is a cross-section of a respective second bonding pin in an array substrate in some embodiments of the present disclosure. FIG. 13 may be a cross-sectional view along a B-B' in FIG. 12. Referring to FIG. 12 and FIG. 13, a respective second bonding pin BP2 in some embodiments includes a first-second metal sub-layer MSL12 in a same layer as a first signal line layer in a display area; a passivation layer PVX on the first-second metal sub-layer MSL12; a second-second metal sub-layer MSL22 in a same layer as a second signal line layer in the display area, on a side of the passivation layer PVX away from the first-second metal sub-layer MSL12, the second-second metal sub-layer MSL22 connecting to the first-second metal sub-layer MSL12 through a via extending through the passivation layer PVX; a second planarization layer PLN2 on a side of the second-second metal sub-layer MSL22 away from the passivation layer PVX; a third-second metal sub-layer MSL32 in a same layer as a first touch electrode layer in the display area, on a side of the second planarization layer PLN2 away from the second-second metal sub-layer MSL22, the third-second metal sub-layer MSL32 connecting to the second-second metal sub-layer MSL22 through a via extending through the second planarization layer PLN2; and a fourth-second metal sub-layer MSL42 in a same layer as a second touch electrode layer in the display area, the fourth-second metal sub-layer MSL42 encapsulating both edges of the third-second metal sub-layer MSL32 along the two longitudinal sides.

Figure 14:
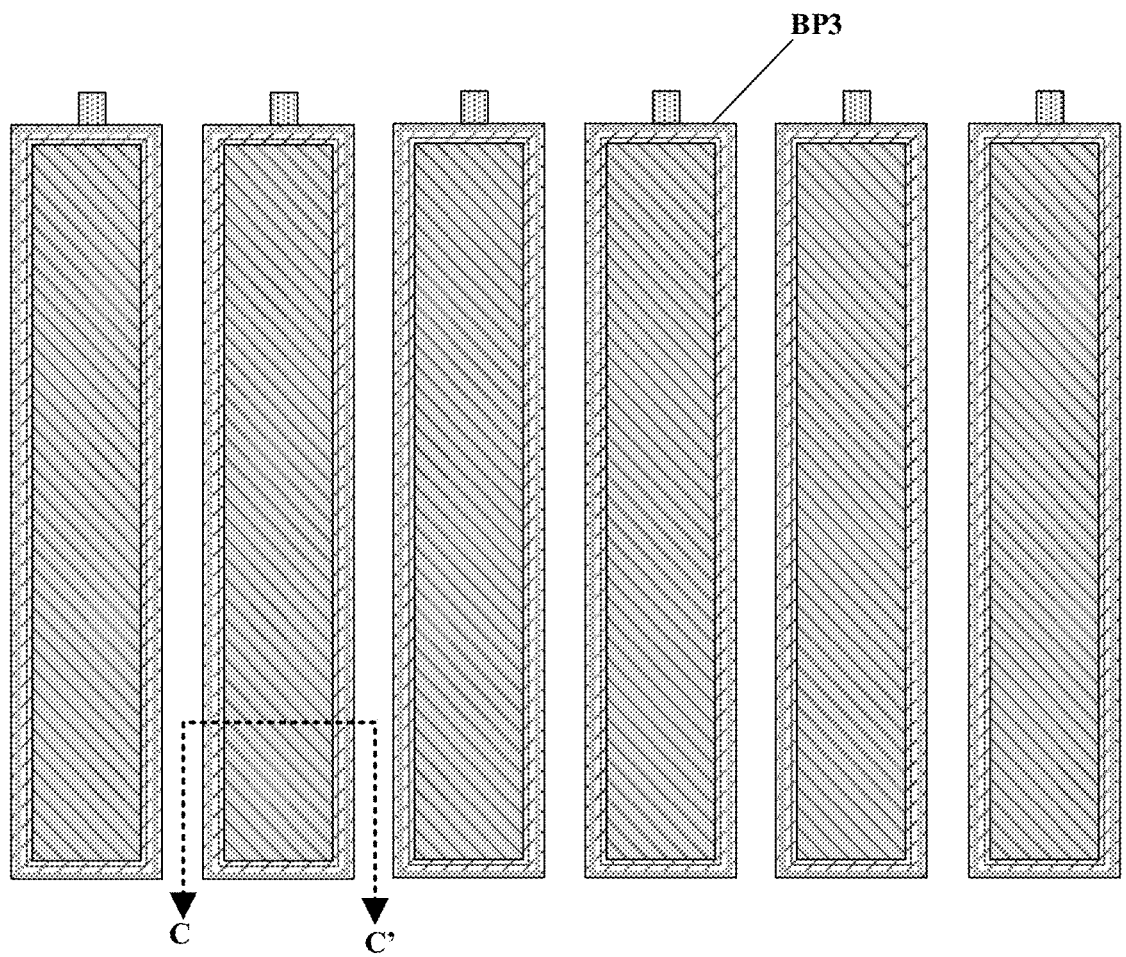
FIG. 14 is a schematic diagram of a respective third bonding pin in some embodiments of the present disclosure.
Figure 15:
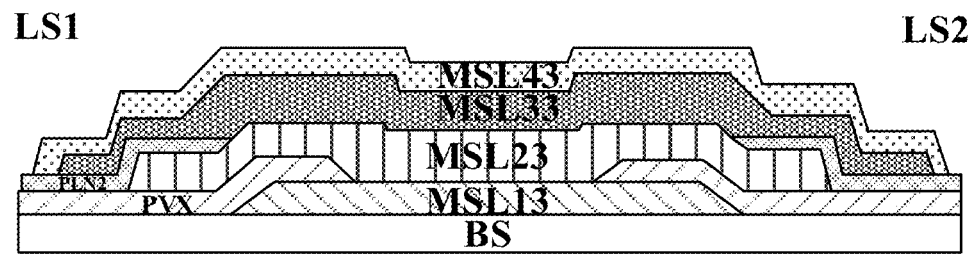
FIG. 15 is a cross-section of a respective third bonding pin in an array substrate in some embodiments of the present disclosure.

In some embodiments, the plurality of bonding pins include multiple third bonding pins. Examples of third bonding pins include dummy bonding pins, ground signal lines, and guard lines. FIG. 14 is a cross-section of a respective third bonding pin in an array substrate in some embodiments of the present disclosure. FIG. 15 is a cross-section of a respective third bonding pin in an array substrate in some embodiments of the present disclosure. FIG. 15 may be a cross-sectional view along a C-C' in FIG. 14. Referring to FIG. 14 and FIG. 15, a respective third bonding pin BP3 in some embodiments includes a first-third metal sub-layer MSL13 in a same layer as a first signal line layer in a display area; a passivation layer PVX on the first-third metal sub-layer MSL13; a second-third metal sub-layer MSL23 in a same layer as a second signal line layer in the display area, on a side of the passivation layer PVX away from the first-third metal sub-layer MSL13, the second-third metal sub-layer MSL23 connecting to the first-third metal sub-layer MSL13 through a via extending through the passivation layer PVX; a second planarization layer PLN2 on a side of the second-third metal sub-layer MSL23 away from the passivation layer PVX; a third-third metal sub-layer MSL33 in a same layer as a first touch electrode layer in the display area, on a side of the second planarization layer PLN2 away from the second-third metal sub-layer MSL23, the third-third metal sub-layer MSL33 connecting to the second-third metal sub-layer MSL23 through a via extending through the second planarization layer PLN2; and a fourth-third metal sub-layer MSL43 in a same layer as a second touch electrode layer in the display area, the fourth-third metal sub-layer MSL43 encapsulating both edges of the third-third metal sub-layer MSL33 along the two longitudinal sides.

In some embodiments, the array substrate includes a touch control structure in at least a display area of the array substrate. In some embodiments, referring to FIG. 4, the touch control structure includes a first touch electrode layer TE1 on a buffer layer BUF; a touch insulating layer TI on a side of the first touch electrode layer TE1 away from the buffer layer BUF; and a second touch electrode layer TE2 on a side of the touch insulating layer TI away from the first touch electrode layer TE1. Referring to FIG. 4, FIG. 5, FIG. 7, and FIG. 8, in some embodiments, the (N−1)-th metal sub-layer MSL(N−1) is in a same layer as the first touch electrode layer TE1; and the N-th metal sub-layer MSLN is in a same layer as the second touch electrode layer TE2.

Figure 16:
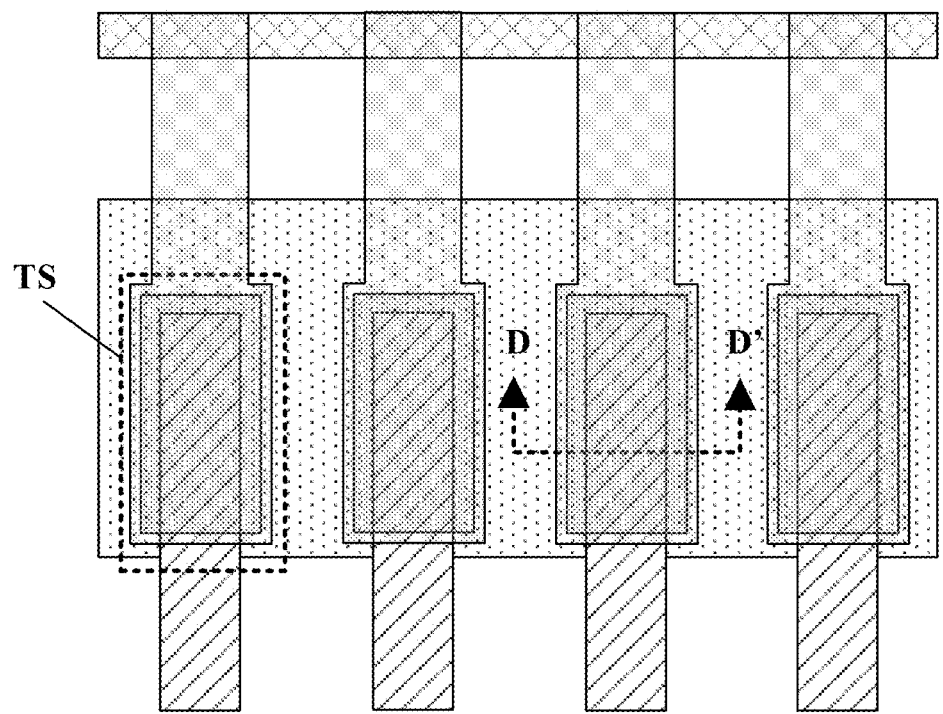
FIG. 16 is a schematic diagram illustrating the structure of a plurality of transition structures in an array substrate in some embodiments of the present disclosure.
Figure 17:
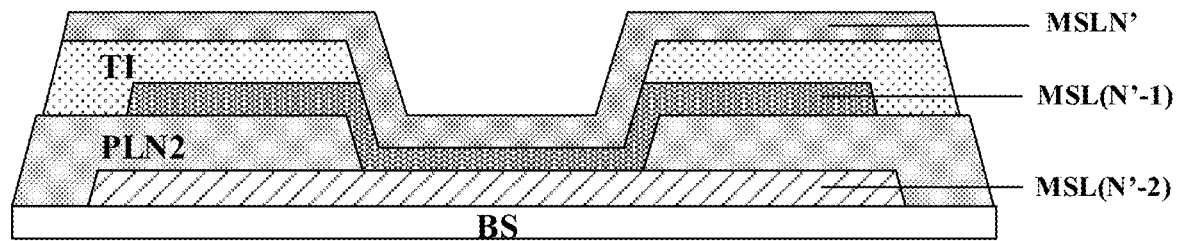
FIG. 17 is a cross-section of a respective transition structure in an array substrate in some embodiments of the present disclosure.

Referring to FIG. 2A, the array substrate in some embodiments further includes a plurality of transition structures TS in a bonding pin area BPA. In some embodiments, FIG. 16 is a schematic diagram illustrating the structure of a plurality of transition structures in an array substrate in some embodiments of the present disclosure. FIG. 17 is a cross-section of a respective transition structure in an array substrate in some embodiments of the present disclosure. FIG. 17 may be a cross-sectional view along a D-D' line in FIG. 16. Referring to FIG. 2A, FIG. 16, and FIG. 17, a respective transition structure of the plurality of transition structures TS in some embodiments includes a stacked structure comprising an (N'−2)-th metal sub-layer MSL(N'−2), an (N'−1)-th metal sub-layer MSL(N'−1), and an N'-th metal sub-layer MSLN' sequentially arranged on the base substrate BS. Optionally, N' being an integer$\geq 2$.

Optionally, referring to FIG. 2A, FIG. 5, FIG. 7, and FIG. 17, the (N'−2)-th metal sub-layer MSL(N'−2) and the (N−2)-th metal sub-layer MSL(N−2) are parts of a unitary structure extending in bonding pin area BPA.

Optionally, referring to FIG. 2A, FIG. 5, FIG. 7, and FIG. 17, the (N'−1)-th metal sub-layer MSL(N'−1) and the (N−1)-th metal sub-layer MSL(N−1) are parts of a unitary structure extending in the bonding pin area BPA.

Optionally, referring to FIG. 2A, FIG. 5, FIG. 7, and FIG. 17, the N'-th metal sub-layer MSLN' and the N-th metal sub-layer MSLN are parts of a unitary structure extending in the bonding pin area BPA.

Optionally, the respective transition structure has at least one less metal sub-layer than the respective bonding pin.

In some embodiments, in a second cross-section along a plane perpendicular to the base substrate BS, parallel to at least one of the two lateral sides of the elongated shape of the respective bonding pin, and intersecting all metal sub-layers of the respective transition structure (e.g., the cross-section as shown in FIG. 17), the (N'−2)-th metal sub-layer MSL(N'−2) and the (N'−1)-th metal sub-layer MSL(N'−1) of the respective transition structure are completely unexposed. Optionally, an orthographic projection of the N'-th metal sub-layer MSLN' on the base substrate completely covers an orthographic projection of the (N'−1)-th metal sub-layer MSL(N'−1) on the base substrate BS.

Figure 18:
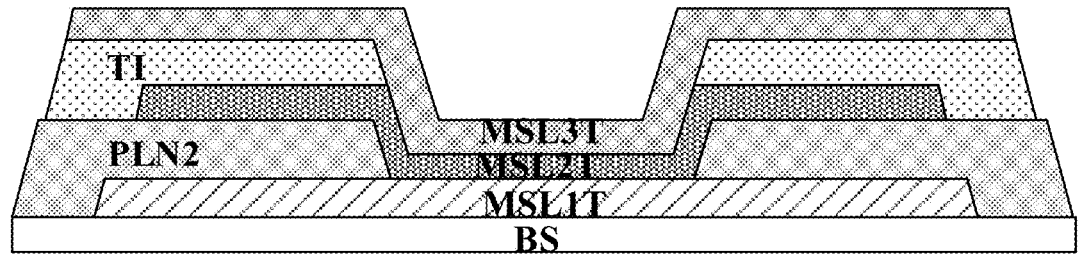
FIG. 18 is a cross-section of a respective transition structure in an array substrate in some embodiments of the present disclosure.

FIG. 18 is a cross-section of a respective transition structure in an array substrate in some embodiments of the present disclosure. FIG. 18 may be a cross-sectional view along a D-D' line in FIG. 16. Referring to FIG. 18, the respective transition structure in some embodiments includes a first-transition metal sub-layer MSL1T in a same layer as a second signal line layer in a display area; a second planarization layer PLN2 on the first-transition metal sub-layer MSL1T; a second-transition metal sub-layer MSL2T in a same layer as a first touch electrode layer in the display area, on a side of the second planarization layer PLN2 away from the first-transition metal sub-layer MSL1T, the second-transition metal sub-layer MSL2T connecting to the first-transition metal sub-layer MSL1T through a via extending through the second planarization layer PLN2; a touch insulating layer TI on a side of the second-transition metal sub-layer MSL2T away from the second planarization layer PLN2; and a third-transition metal sub-layer MSL3T in a same layer as a second touch electrode layer in the display area, on a side of the touch insulating layer TI away from the second-transition metal sub-layer MSL2T, the third-transition metal sub-layer MSL3T connecting to the second-transition metal sub-layer MSL2T through a via extending through the touch insulating layer TI. Optionally, the touch insulating layer TI encapsulates edges of the second-transition metal sub-layer MSL2T.

Figure 19:
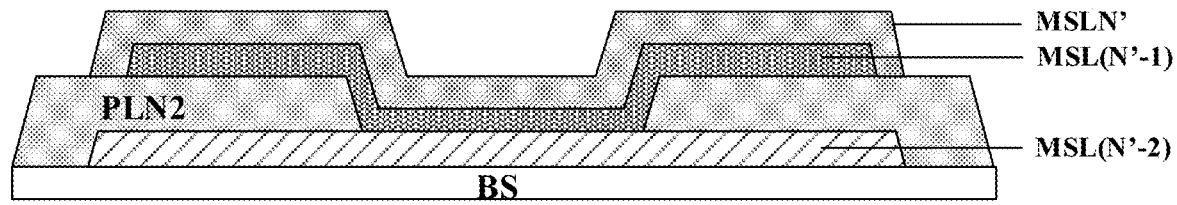
FIG. 19 is a cross-section of a respective transition structure in an array substrate in some embodiments of the present disclosure.

FIG. 19 is a cross-section of a respective transition structure in an array substrate in some embodiments of the present disclosure. FIG. 19 may be a cross-sectional view along a D-D' line in FIG. 16. Referring to FIG. 19, in some embodiments, the (N'-1)-th metal sub-layer MSL(N'-1) is in direct contact with the (N'-2)-th metal sub-layer MSL(N'-2). Optionally, in the second cross-section, the (N'-2)-th metal sub-layer MSL(N'-2) is encapsulated by the second planarization layer PLN2, thereby rendering the (N'-2)-th metal sub-layer MSL(N'-2) unexposed.

Figure 20:
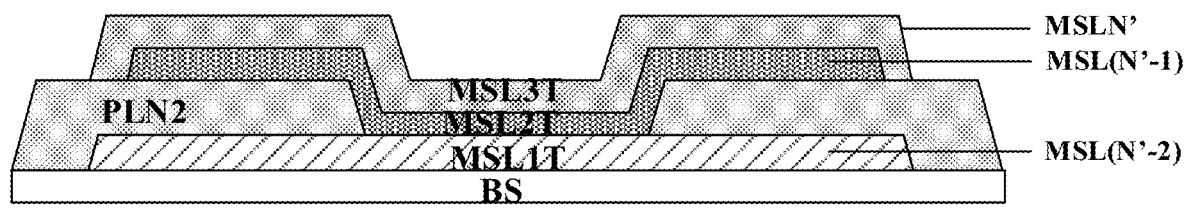
FIG. 20 is a cross-section of a respective transition structure in an array substrate in some embodiments of the present disclosure.

FIG. 20 is a cross-section of a respective transition structure in an array substrate in some embodiments of the present disclosure. FIG. 20 may be a cross-sectional view along a D-D' line in FIG. 16. Referring to FIG. 20, the respective transition structure in some embodiments includes a first-transition metal sub-layer MSL1T in a same layer as a second signal line layer in a display area; a second planarization layer PLN2 on the first-transition metal sub-layer MSL1T; a second-transition metal sub-layer MSL2T in a same layer as a first touch electrode layer in the display area, on a side of the second planarization layer PLN2 away from the first-transition metal sub-layer MSL1T, the second-transition metal sub-layer MSL2T connecting to the first-transition metal sub-layer MSL1T through a via extending through the second planarization layer PLN2; and a third-transition metal sub-layer MSL3T in a same layer as a second touch electrode layer in the display area, on a side of the second-transition metal sub-layer MSL2T away from the first-transition metal sub-layer MSL1T, the third-transition metal sub-layer MSL3T connecting to the second-transition metal sub-layer MSL2T. Optionally, the third-transition metal sub-layer MSL3T encapsulates edges of the second-transition metal sub-layer MSL2T.

Figure 21:
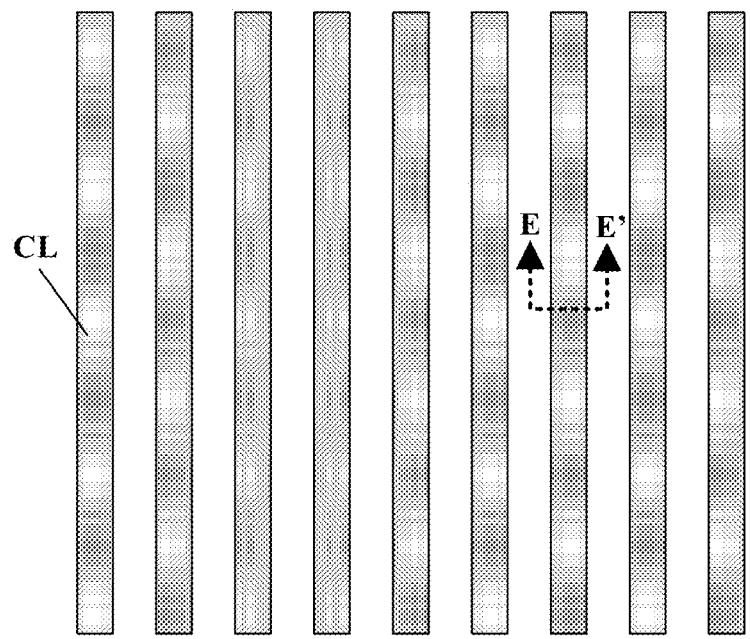
FIG. 21 is a schematic diagram illustrating the structure of a plurality of connecting lines in an array substrate in some embodiments of the present disclosure.
Figure 22:
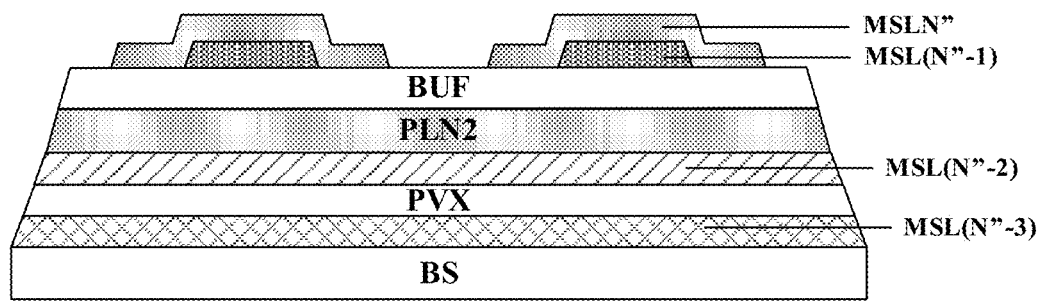
FIG. 22 is a cross-section of a respective connecting line in an array substrate in some embodiments of the present disclosure.

Referring to FIG. 2A, the array substrate in some embodiments further includes a plurality of connecting lines CL in a fanout area FA. FIG. 21 is a schematic diagram illustrating the structure of a plurality of connecting lines in an array substrate in some embodiments of the present disclosure. FIG. 22 is a cross-section of a respective connecting line in an array substrate in some embodiments of the present disclosure. FIG. 22 may be a cross-sectional view along a E-E' line in FIG. 21. Referring to FIG. 21 and FIG. 22, a respective connecting line of the plurality of connecting lines CL includes a stacked structure comprising an (N"-1)-th metal sub-layer MSL(N"-1) and an N"-th metal sub-layer MSLN" sequentially arranged on the base substrate BS. Optionally, N" being an integer≥2

Optionally, referring to FIG. 2A, FIG. 5, FIG. 7, FIG. 17, and FIG. 22, the (N"-1)-th metal sub-layer MSL(N"-1) and the (N-1)-th metal sub-layer MSL(N-1) are parts of a unitary structure extending from the fanout area FA into the bonding pin area BPA. Optionally, the (N"-1)-th metal sub-layer MSL(N"-1), the (N'-1)-th metal sub-layer MSL(N'-1), and the (N-1)-th metal sub-layer MSL(N-1) are parts of a unitary structure extending from the fanout area FA into the bonding pin area BPA.

Optionally, referring to FIG. 2A, FIG. 5, FIG. 7, FIG. 17, and FIG. 22, the N"-th metal sub-layer MSLN" and the N-th metal sub-layer MSLN are parts of a unitary structure extending from the fanout area FA into the bonding pin area BPA. Optionally, the N"-th metal sub-layer MSLN", the N'-th metal sub-layer MSLN', and the N-th metal sub-layer MSLN are parts of a unitary structure extending from the fanout area FA into the bonding pin area BPA.

Optionally, the respective connecting line has at least one less metal sub-layer than the respective bonding pin.

In some embodiments, in a third cross-section along a plane perpendicular to the base substrate, parallel to at least one of the two lateral sides of the elongated shape of the respective bonding pin, and intersecting all metal sub-layers of the respective connecting line, the (N"-1)-th metal sub-layer MSL(N"-1) of the respective connecting line is completely unexposed.

In some embodiments, an orthographic projection of the N"-th metal sub-layer MSLN" on the base substrate BS completely covers an orthographic projection of the (N"-1)-th metal sub-layer MSL(N"-1) on the base substrate BS.

In some embodiments, the N"-th metal sub-layer MSLN" is in direct contact with the (N"-1)-th metal sub-layer MSL(N"-1). Optionally, in the third cross-section, the (N"-1)-th metal sub-layer is encapsulated by the N"-th metal sub-layer, thereby rendering the (N"-1)-th metal sub-layer unexposed.

Figure 23:
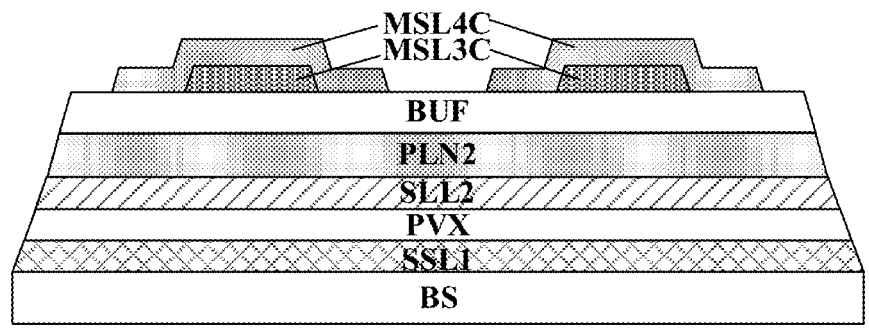
FIG. 23 is a cross-section of a respective connecting line in an array substrate in some embodiments of the present disclosure.

FIG. 23 is a cross-section of a respective connecting line in an array substrate in some embodiments of the present disclosure. FIG. 23 may be a cross-sectional view along a E-E' line in FIG. 21. Referring to FIG. 21 and FIG. 23, the respective connecting line in some embodiments includes a first connecting metal sub-layer MSL1C in a same layer as a first touch electrode layer in the display area; and a second connecting metal sub-layer MSL2C in a same layer as a second touch electrode layer in the display area, and on the first connecting metal sub-layer MSL1C. Optionally, the respective connecting line is on a stacked structure comprising a first signal line layer SLL1 on a base substrate BS; a passivation layer PVX on the first signal line layer; a second signal line layer SLL2 on a side of the passivation layer PVX away from the first signal line layer SLL1; a second planarization layer PLN2 on a side of the second signal line layer SLL2 away from the passivation layer PVX; and a buffer layer BUF on a side of the second planarization layer PLN2 away from the second signal line layer SLL2.

In another aspect, the present disclosure provides a display apparatus including the array substrate described herein or fabricated by a method described herein, and one or more integrated circuits connected to the array substrate. Examples of appropriate display apparatuses include, but are not limited to, an electronic paper, a mobile phone, a tablet computer, a television, a monitor, a notebook computer, a digital album, a GPS, etc. Optionally, the display apparatus is an organic light emitting diode display apparatus. Optionally, the display apparatus is a mini light emitting diode display apparatus. Optionally, the display apparatus is a micro light emitting diode display apparatus.

Figure 24:
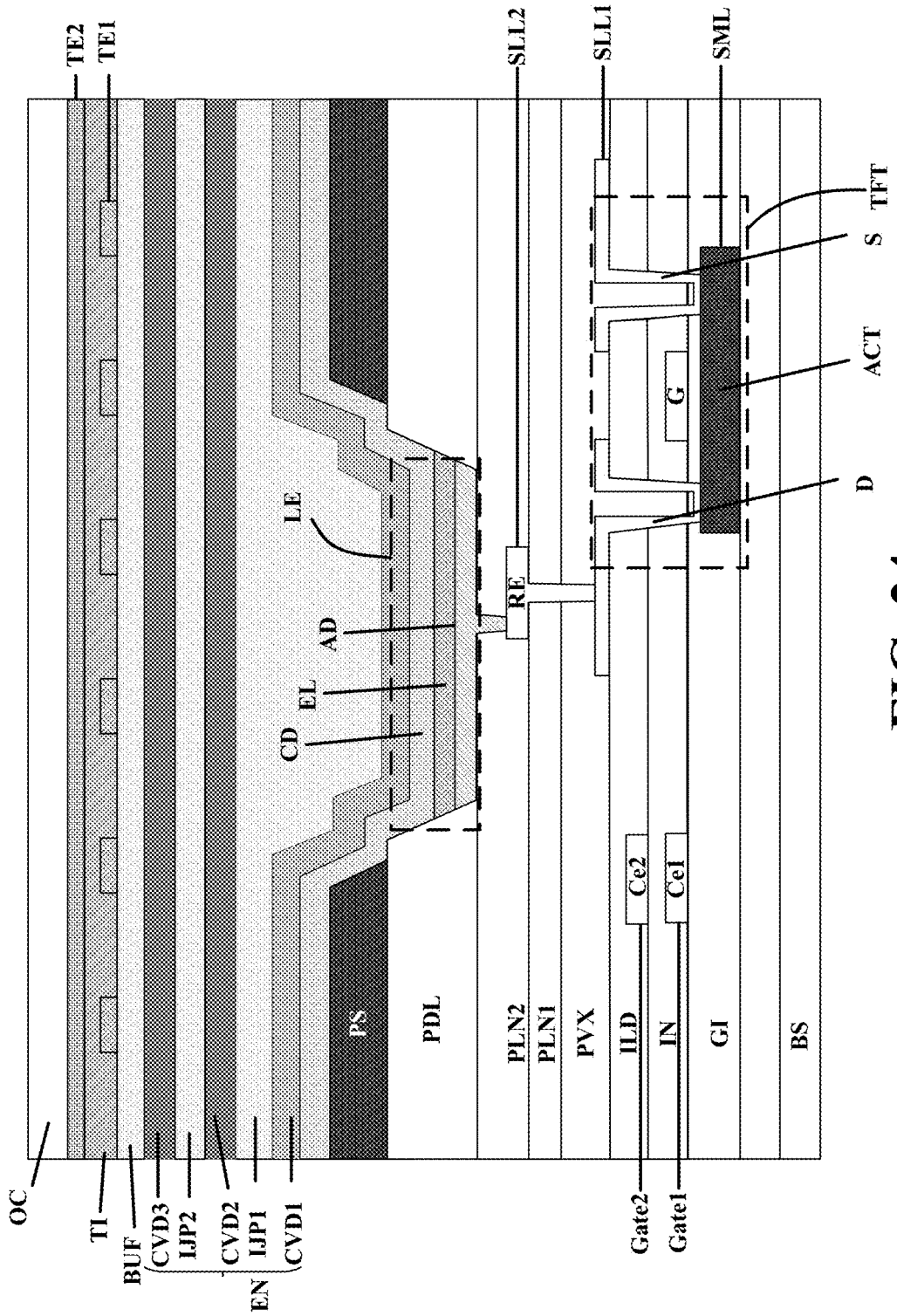
FIG. 24 illustrates a detailed structure in a display area in a display apparatus in some embodiments according to the present disclosure.

FIG. 24 illustrates a detailed structure in a display area in a display apparatus in some embodiments according to the present disclosure. Referring to FIG. 24, the display apparatus in the display area in some embodiments includes a base substrate BS (e.g., a flexible base substrate); an active layer ACT of a respective one of a plurality of thin film transistors TFT on the base substrate BS; a gate insulating layer GI on a side of the active layer ACT away from the base substrate BS; a gate electrode G and a first capacitor electrode Ce1 (both are parts of a first gate metal layer) on a side of the gate insulating layer GI away from the base substrate BS; an insulating layer IN on a side of the gate electrode G and the first capacitor electrode Ce1 away from the gate insulating layer GI; a second capacitor electrode Ce2 (a part of a second gate metal layer) on a side of the insulating layer IN away from the gate insulating layer GI; an inter-layer dielectric layer ILD on a side of the second capacitor electrode Ce2 away from the gate insulating layer GI; a source electrode S and a drain electrode D (parts of a first SD metal layer) on a side of the inter-layer dielectric layer ILD away from the gate insulating layer GI; a passivation layer PVX on a side of the source electrode S and the drain electrode D away from the inter-layer dielectric layer ILD; a first planarization layer PLN1 on a side of the passivation layer PVX away from the inter-layer dielectric layer ILD; a second planarization layer PLN2 on side of the first planarization layer PLN1 away from the passivation layer PVX; a relay electrode RE (part of a second SD metal layer) on a side of the second planarization layer PLN2 away from the first planarization layer PLN1; a pixel definition layer PDL defining a subpixel aperture and on a side of the second planarization layer PLN2 away from the base substrate BS; and a light emitting element LE in the subpixel aperture. The light emitting element LE includes an anode AD on a side of the second planarization layer PLN2 away from the first planarization layer PLN1; a light emitting layer EL on a side of the anode AD away from the second planarization layer PLN2; and a cathode layer CD on a side of the light emitting layer EL away from the anode AD. The display apparatus in the display area further includes an encapsulating layer EN encapsulating the light emitting element LE, and on a side of the cathode layer CD away from the base substrate BS.

The encapsulating layer EN in some embodiments includes a first inorganic encapsulating sub-layer CVD1 on a side of the cathode layer CD away from the base substrate BS, a first organic encapsulating sub-layer IJP1 on a side of the first inorganic encapsulating sub-layer CVD1 away from the base substrate BS, a second inorganic encapsulating sub-layer CVD2 on a side of the first organic encapsulating sub-layer IJP1 away from the base substrate BS, a second organic encapsulating sub-layer IJP2 on a side of the second inorganic encapsulating sub-layer CVD2 away from the base substrate BS, and a third inorganic encapsulating sub-layer CVD3 on a side of the second organic encapsulating sub-layer IJP2 away from the base substrate BS.

The display apparatus in the display area further includes a buffer layer BUF on a side of the encapsulating layer EN away from the base substrate BS; a first touch electrode layer TE1 on a side of the buffer layer BUF away from the encapsulating layer EN; a touch insulating layer TI on a side of the first touch electrode layer TE1 away from the buffer layer BUF; a second touch electrode layer TE2 on a side of the touch insulating layer TI away from the buffer layer BUF; and an overcoat layer OC on a side of the second touch electrode layer TE2 away from the touch insulating layer TI.

Referring to FIG. 24, the display apparatus includes a semiconductor material layer SML, a first gate metal layer Gate1, a second gate metal layer Gate2, a first signal line layer SLL1, and a second signal line layer SLL2. The display apparatus further includes an insulating layer IN between the first gate metal layer Gate1 and the second gate metal layer Gate2; an inter-layer dielectric layer ILD between the second conductive layer Gate2 and the first signal line layer SLL1; and at least a passivation layer PVX or a planarization layer PLN between the first signal line layer SLL1 and the second signal line layer SLL2.

In another aspect, the present disclosure provides a method of fabricating an array substrate. In some embodiments, the method includes forming a plurality of bonding pins in a bonding pin area. Optionally, forming a respective bonding pin of the plurality of bonding pins includes forming a stacked structure comprising N number of metal sub-layers sequentially arranged on a base substrate. Optionally, a first metal sub-layer of the N number of metal sub-layers is on a side of an N-th metal sub-layer of the N number of metal sub-layers closer to the base substrate. Optionally, the N-th metal sub-layer being a last metal sub-layer of the respective bonding pin. Optionally, N is an integer≥2. Optionally, in plan view of the array substrate, the respective bonding pin has an elongated shape having two longitudinal sides and two lateral sides. Optionally, in a first cross-section along a plane perpendicular to the base substrate, parallel to at least one of the two lateral sides, and intersecting the N number of metal sub-layers of the respective bonding pin, any of the first metal sub-layer to an (N−1)-th metal sub-layer are completely unexposed.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. An array substrate, comprising a plurality of bonding pins in a bonding pin area, and a touch control structure in at least a display area of the array substrate;
   wherein a respective bonding pin of the plurality of bonding pins is a stacked structure comprising N number of metal sub-layers sequentially arranged on a base substrate, a first metal sub-layer of the N number of metal sub-layers on a side of an N-th metal sub-layer of the N number of metal sub-layers closer to the base substrate, the N-th metal sub-layer being a last metal sub-layer of the respective bonding pin, N is an integer$\geq 2$;
   wherein, in plan view of the array substrate, the respective bonding pin has an elongated shape having two longitudinal sides and two lateral sides; and
   in a first cross-section along a plane perpendicular to the base substrate, parallel to at least one of the two lateral sides, and intersecting the N number of metal sub-layers of the respective bonding pin, any of the first metal sub-layer to an (N−1)-th metal sub-layer of the respective bonding pin are completely unexposed;
   wherein the touch control structure comprises:
   a first touch electrode layer on a buffer layer;
   a touch insulating layer on a side of the first touch electrode layer away from the buffer layer;
   a second touch electrode layer on a side of the touch insulating layer away from the first touch electrode layer;
   wherein the (N−1)-th metal sub-layer is in a same layer as the first touch electrode layer; and
   the N-th metal sub-layer is in a same layer as the second touch electrode layer.

2. The array substrate of claim 1, wherein, in the first cross-section, the N-th metal sub-layer is in direct contact with the (N−1)-th metal sub-layer; and
   an edge of the (N−1)-th metal sub-layer along at least one of the two longitudinal sides is encapsulated by the N-th metal sub-layer, thereby rendering the edge of the (N−1)-th metal sub-layer along at least one of the two longitudinal sides unexposed.

3. The array substrate of claim 1, wherein edges of the (N−1)-th metal sub-layer along both of the two longitudinal sides are encapsulated by the N-th metal sub-layer and an underlying layer together, thereby rendering the edges of the (N−1)-th metal sub-layer along both of the two longitudinal sides unexposed.

4. The array substrate of claim 1, wherein an orthographic projection of the N-th metal sub-layer on the base substrate completely covers an orthographic projection of the (N−1)-th metal sub-layer on the base substrate.

5. The array substrate of claim 1, wherein, in the first cross-section, the n-th metal sub-layer is in direct contact with the (n−1)-th metal sub-layer, $1 < n \leq N$; and
   an edge of the (n−1)-th metal sub-layer along at least one of the two longitudinal sides is encapsulated by the n-th metal sub-layer.

6. The array substrate of claim 1, wherein edges of the (n−1)-th metal sub-layer along both of the two longitudinal sides are encapsulated by the n-th metal sub-layer and an underlying layer together, thereby rendering the edges of the (n−1)-th metal sub-layer along both of the two longitudinal sides unexposed, $1 < n \leq N$.

7. The array substrate of claim 1, wherein an orthographic projection of the n-th metal sub-layer on the base substrate completely covers an orthographic projection of the (n−1)-th metal sub-layer on the base substrate, $1 < n \leq N$.

8. An array substrate, comprising a plurality of bonding pins in a bonding pin area, and a plurality of transition structures in a bonding pin area;
   wherein a respective bonding pin of the plurality of bonding pins is a stacked structure comprising N number of metal sub-layers sequentially arranged on a base substrate, a first metal sub-layer of the N number of metal sub-layers on a side of an N-th metal sub-layer of the N number of metal sub-layers closer to the base substrate, the N-th metal sub-layer being a last metal sub-layer of the respective bonding pin, N is an integer$\geq 2$;
   wherein, in plan view of the array substrate, the respective bonding pin has an elongated shape having two longitudinal sides and two lateral sides; and
   in a first cross-section along a plane perpendicular to the base substrate, parallel to at least one of the two lateral sides, and intersecting the N number of metal sub-layers of the respective bonding pin, any of the first metal sub-layer to an (N−1)-th metal sub-layer of the respective bonding pin are completely unexposed;
   wherein a respective transition structure of the plurality of transition structures comprises a stacked structure comprising an (N'−2)-th metal sub-layer, an (N'−1)-th metal sub-layer, and an N'-th metal sub-layer sequentially arranged on the base substrate;
   the (N'−2)-th metal sub-layer and an (N−2)-th metal sub-layer of the respective bonding pin are parts of a unitary structure extending in the bonding pin area;
   the (N'−1)-th metal sub-layer and the (N−1)-th metal sub-layer are parts of a unitary structure extending in the bonding pin area;
   the N'-th metal sub-layer and the N-th metal sub-layer are parts of a unitary structure extending in the bonding pin area;
   the respective transition structure has at least one less metal sub-layer than a respective bonding pin; and
   in a second cross-section along a plane perpendicular to the base substrate, parallel to at least one of the two lateral sides of the elongated shape of the respective bonding pin, and intersecting all metal sub-layers of the respective transition structure, the (N'−2)-th metal sub-layer and the (N'−1)-th metal sub-layer of the respective transition structure are completely unexposed, N' being an integer$\geq 2$.

9. The array substrate of claim 8, wherein an orthographic projection of the N'-th metal sub-layer on the base substrate completely covers an orthographic projection of the (N'−1)-th metal sub-layer on the base substrate.

10. The array substrate of claim 8, wherein the (N'−1)-th metal sub-layer is in direct contact with the (N'−2)-th metal sub-layer; and
    in the second cross-section, the (N'−2)-th metal sub-layer is encapsulated by the (N'−1)-th metal sub-layer, thereby rendering the (N'−2)-th metal sub-layer unexposed.

11. The array substrate of claim 8, wherein the respective transition structure comprises:
    a first-transition metal sub-layer in a same layer as a second signal line layer in a display area;
    a planarization layer on the first-transition metal sub-layer;
    a second-transition metal sub-layer in a same layer as a first touch electrode layer in the display area, on a side of the planarization layer away from the first-transition metal sub-layer, the second-transition metal sub-layer connecting to the first-transition metal sub-layer through a via extending through the planarization layer;
a touch insulating layer on a side of the second-transition metal sub-layer away from the planarization layer; and
a third-transition metal sub-layer in a same layer as a second touch electrode layer in the display area, on a side of the touch insulating layer away from the second-transition metal sub-layer, the third-transition metal sub-layer connecting to the second-transition metal sub-layer through a via extending through the touch insulating layer;
wherein the touch insulating layer encapsulates edges of the second-transition metal sub-layer.

12. An array substrate, comprising a plurality of bonding pins in a bonding pin area a plurality of connecting lines in a fanout area;
wherein a respective bonding pin of the plurality of bonding pins is a stacked structure comprising N number of metal sub-layers sequentially arranged on a base substrate, a first metal sub-layer of the N number of metal sub-layers on a side of an N-th metal sub-layer of the N number of metal sub-layers closer to the base substrate, the N-th metal sub-layer being a last metal sub-layer of the respective bonding pin, N is an integer≥2;
wherein, in plan view of the array substrate, the respective bonding pin has an elongated shape having two longitudinal sides and two lateral sides; and
in a first cross-section along a plane perpendicular to the base substrate, parallel to at least one of the two lateral sides, and intersecting the N number of metal sub-layers of the respective bonding pin, any of the first metal sub-layer to an (N−1)-th metal sub-layer of the respective bonding pin are completely unexposed;
wherein a respective connecting line of the plurality of connecting lines comprises a stacked structure comprising an (N"−1)-th metal sub-layer and an N"-th metal sub-layer sequentially arranged on the base substrate;
the (N"−1)-th metal sub-layer and the (N−1)-th metal sub-layer are parts of a unitary structure extending from the fanout area into the bonding pin area;
the N"-th metal sub-layer and the N-th metal sub-layer are parts of a unitary structure extending from the fanout area into the bonding pin area;
the respective connecting line has at least one less metal sub-layer than a respective bonding pin; and
in a third cross-section along a plane perpendicular to the base substrate, parallel to at least one of the two lateral sides of the elongated shape of the respective bonding pin, and intersecting all metal sub-layers of the respective connecting line, the (N"−1)-th metal sub-layer of the respective connecting line is completely unexposed, N" being an integer≥2.

13. The array substrate of claim 12, wherein an orthographic projection of the N"-th metal sub-layer on the base substrate completely covers an orthographic projection of the (N"−1)-th metal sub-layer on the base substrate.

14. The array substrate of claim 12, wherein the N"-th metal sub-layer is in direct contact with the (N"−1)-th metal sub-layer; and
in the third cross-section, the (N"−1)-th metal sub-layer is encapsulated by the N"-th metal sub-layer, thereby rendering the (N"−1)-th metal sub-layer unexposed.

15. The array substrate of claim 12, wherein the respective connecting line comprises:

a first connecting metal sub-layer in a same layer as a first touch electrode layer in a display area; and
a second connecting metal sub-layer in a same layer as a second touch electrode layer in the display area, and on the first connecting metal sub-layer;
wherein the respective connecting line is on a stacked structure comprises:
a first signal line layer on a base substrate;
a passivation layer on the first signal line layer;
a second signal line layer on a side of the passivation layer away from the first signal line layer;
a planarization layer on a side of the second signal line layer away from the passivation layer; and
a buffer layer on a side of the planarization layer away from the second signal line layer.

16. The array substrate of claim 1, wherein the plurality of bonding pins comprise multiple first bonding pins configured for bonding an integrated circuit;
wherein a respective first bonding pin of the multiple first bonding pins comprises:
a first-first metal sub-layer in a same layer as a first conductive layer in a display area;
an insulating layer and/or an inter-layer dielectric layer on the first-first metal sub-layer;
a second-first metal sub-layer in a same layer as a first signal line layer in the display area, on a side of the insulating layer and/or the inter-layer dielectric layer away from the first-first metal sub-layer, the second-first metal sub-layer connecting to the first-first metal sub-layer through a via extending through the insulating layer and/or the inter-layer dielectric layer;
a third-first metal sub-layer in a same layer as a second signal line layer in the display area, the third-first metal sub-layer encapsulating the second-first metal sub-layer;
a fourth-first metal sub-layer in a same layer as a first touch electrode layer in the display area, the fourth-first metal sub-layer encapsulating an edge of the third-first metal sub-layer along at least one of the two longitudinal sides; and
a fifth-first metal sub-layer in a same layer as a second touch electrode layer in the display area, the fifth-first metal sub-layer encapsulating an edge of the fourth-first metal sub-layer along at least one of the two longitudinal sides.

17. The array substrate of claim 1, wherein the plurality of bonding pins comprise multiple second bonding pins configured for bonding a printed circuit;
wherein a respective second bonding pin of the multiple second bonding pins comprises:
a first-second metal sub-layer in a same layer as a first signal line layer in a display area;
a passivation layer on the first-second metal sub-layer;
a second-second metal sub-layer in a same layer as a second signal line layer in the display area, on a side of the passivation layer away from the first-second metal sub-layer, the second-second metal sub-layer connecting to the first-second metal sub-layer through a via extending through the passivation layer;
a planarization layer on a side of the second-second metal sub-layer away from the passivation layer;
a third-second metal sub-layer in a same layer as a first touch electrode layer in the display area, on a side of the planarization layer away from the second-second metal sub-layer, the third-second metal sub-layer connecting to the second-second metal sub-layer through a via extending through the planarization layer; and a fourth-second metal sub-layer in a same layer as a second touch electrode layer in the display area, the fourth-second metal sub-layer encapsulating both edges of the third-second metal sub-layer along the two longitudinal sides.

18. A display apparatus, comprising the array substrate of claim 1, an integrated circuit bonded to the array substrate in the bonding pin area.

* * * * *